United States Patent
Endo et al.

(10) Patent No.: US 11,018,034 B2
(45) Date of Patent: May 25, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Toru Endo, Kyoto (JP); Masayuki Hayashi, Kyoto (JP); Nobuyuki Shibayama, Kyoto (JP)

(73) Assignee: SCREEN Holdings Co., Ltd.

( * ) Notice: Subject to any disclaimer, the term of this patent is extended or adjusted under 35 U.S.C. 154(b) by 36 days.

(21) Appl. No.: 16/355,909

(22) Filed: Mar. 18, 2019

(65) Prior Publication Data
US 2019/0295862 A1   Sep. 26, 2019

(30) Foreign Application Priority Data

Mar. 26, 2018  (JP) .............................. JP2018-057500

(51) Int. Cl.
*H01L 21/67* (2006.01)
*G03F 7/30* (2006.01)
*B08B 3/08* (2006.01)

(52) U.S. Cl.
CPC ........ *H01L 21/6715* (2013.01); *G03F 7/3021* (2013.01); *B08B 3/08* (2013.01); *H01L 21/67051* (2013.01)

(58) Field of Classification Search
CPC ........... H01L 21/6715; H01L 21/67051; H01L 21/67028; H01L 21/67248; G03F 7/3021; G03F 7/42; B08B 3/08; B05D 1/005
See application file for complete search history.

(56) References Cited

U.S. PATENT DOCUMENTS

| | | | |
|---|---|---|---|
| 2009/0320885 A1 | 12/2009 | Inoue et al. | |
| 2015/0262848 A1 | 9/2015 | Sano et al. | |
| 2016/0172185 A1* | 6/2016 | Yamakawa | ............. C25B 15/08 205/335 |
| 2018/0025922 A1 | 1/2018 | Tsujikawa et al. | |
| 2018/0029089 A1 | 2/2018 | Miura et al. | |

FOREIGN PATENT DOCUMENTS

| | | | |
|---|---|---|---|
| JP | 2000-077489 A | 3/2000 | |
| JP | 2008130835 A * | 6/2008 | |
| JP | 2010-010421 A | 1/2010 | |
| JP | 2012-199295 A | 10/2012 | |
| JP | 2015-173204 A | 10/2015 | |
| KR | 20030038425 A * | 5/2003 | ............. B08B 3/02 |
| KR | 10-2017-0137252 A | 12/2017 | |
| KR | 10-2018-0012215 A | 2/2018 | |

* cited by examiner

*Primary Examiner* — Kirsten Jolley
(74) *Attorney, Agent, or Firm* — Ostrolenk Faber LLP

(57) ABSTRACT

A substrate processing method includes a substrate holding step of holding a substrate by a substrate holding unit, a chemical liquid supplying step of supplying a chemical liquid to a main surface of the substrate while rotating the substrate around a rotational axis passing through a central portion of the substrate, a foreign matter detecting step of detecting foreign matter, contained in the chemical liquid expelled from the substrate, in parallel with the chemical liquid supplying step, and a flow destination switching step of switching, based on the detection of the foreign matter by the foreign matter detecting step, a flow destination of the chemical liquid expelled from the substrate from a drain piping to a recovery piping during the chemical liquid supplying step.

16 Claims, 12 Drawing Sheets

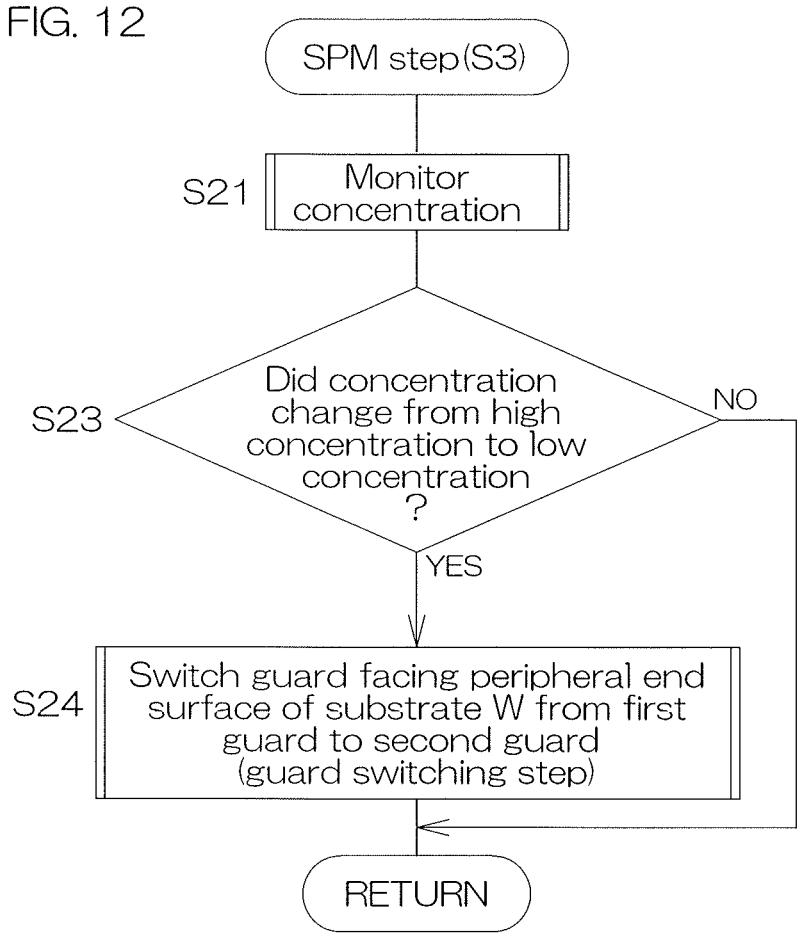

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus. Examples of substrates to be processed include semiconductor wafers, substrates for liquid crystal displays, substrates for plasma displays, substrates for FPDs (flat panel displays), such as organic EL (electroluminescence) displays, etc., substrates for optical disks, substrates for magnetic disks, substrates for magneto-optical disks, substrates for photomasks, ceramic substrates, substrates for solar cells, etc.

2. Description of the Related Art

A single substrate processing type substrate processing apparatus that processes substrates one by one is disclosed in U.S. Unexamined Patent Application Publication No. 2018/025922 A1. A processing unit of the substrate processing apparatus includes a spin chuck, rotating a substrate while holding it horizontally, a chemical liquid nozzle, discharging a chemical liquid toward an upper surface of the substrate held by the spin chuck, and a cylindrical processing cup, surrounding the spin chuck. A flow space, through which the chemical liquid used in processing the substrate is guided, is demarcated in an interior of the processing cup.

Also, the processing unit according to U.S. Unexamined Patent Application Publication No. 2018/025922 A1 is arranged to recover the chemical liquid after being used in processing the substrate and enable reuse of the recovered chemical liquid in subsequent processing. The substrate processing apparatus thus further includes a chemical liquid tank, storing the chemical liquid supplied to the chemical liquid nozzle, and a recovery piping, guiding the chemical liquid from the flow space to the chemical liquid tank.

The processing unit according to U.S. Unexamined Patent Application Publication No. 2018/025922 A1 further includes a switching valve, switching a flow destination of the chemical liquid, flowing through the flow space, between the recovery piping and a drain piping for disposal.

SUMMARY OF THE INVENTION

The substrate processing performed at the processing unit includes a cleaning processing of removing particles and other contamination and resist and other substances to be removed (referred to collectively as "contaminants") from the substrate, and an etching processing of removing a film from the substrate. The chemical liquid expelled from the substrate may thus contain foreign matter such as the contaminants and the film, etc. Recovery of the chemical liquid that contains the foreign matter must be suppressed or prevented.

On the other hand, from a viewpoint of saving the chemical liquid and environmental consideration, etc., it is desirable to limit draining (disposal) of the chemical liquid to a minimum. Therefore, when the chemical liquid expelled from the substrate no longer contains the foreign matter, it is desirable to recover and reuse the chemical liquid.

It may thus be considered to drain the chemical liquid expelled from the substrate in a period in which the chemical liquid expelled from the substrate contains the foreign matter and to recover the chemical liquid expelled from the substrate when a period is thereafter entered in which the foreign matter is not contained. In this case, the flow destination of the chemical liquid expelled from the substrate must be switched from draining to recovery at an appropriate timing.

Thus, an object of the present invention is to provide a substrate processing method and a substrate processing apparatus with which a flow destination of a chemical liquid expelled from a substrate can be switched from draining to recovery at an appropriate timing.

The present invention provides a substrate processing method including a substrate holding step of holding a substrate by a substrate holding unit, a chemical liquid supplying step of supplying a chemical liquid to a main surface of the substrate while rotating the substrate around a rotational axis passing through a central portion of the substrate, a foreign matter detecting step of detecting foreign matter, contained in the chemical liquid expelled from the substrate, in parallel with the chemical liquid supplying step, and a flow destination switching step of switching a flow destination of the chemical liquid expelled from the substrate from a drain piping to a recovery piping during the chemical liquid supplying step, based on the detection of the foreign matter by the foreign matter detecting step.

After some time from start of the chemical liquid supplying step, a large amount of the foreign matter becomes contained in the chemical liquid expelled from the substrate. With elapse of time from the start of the chemical liquid supplying step, chemical liquid processing of the substrate progresses and the amount of the foreign matter contained in the chemical liquid expelled from the substrate decreases. Then, when a predetermined time elapses from the start of the chemical liquid supplying step, a state is reached where the foreign matter is not contained in the chemical liquid expelled from the substrate.

In the present specification, the expression, "the foreign matter is not contained in the chemical liquid," is intended to include the case where the foreign matter is not contained at all in the chemical liquid, the case where the foreign matter is hardly contained in the chemical liquid, and the case where the amount of the foreign matter contained in the chemical liquid is low.

With the present method, the foreign matter contained in the chemical liquid expelled from the substrate is detected in parallel with the chemical liquid supplying step. Based on the detection of the foreign matter, the flow destination of the chemical liquid expelled from the substrate is switched from the drain piping to the recovery piping during the chemical liquid supplying step. The flow destination of the chemical liquid expelled from the substrate can thereby be switched from draining to recovery in accordance with a degree to which the foreign matter is contained in the chemical liquid. The flow destination of the chemical liquid expelled from the substrate can thus be switched from draining to recovery at an appropriate timing.

In the preferred embodiment of the present invention, the flow destination switching step includes a guard switching step of switching a guard, disposed at a capturable position, at which the chemical liquid expelled from the substrate can be captured, from a cylindrical first guard, capturing and guiding the chemical liquid to a first flow space in communication with the drain piping, to a cylindrical second guard, provided separately from the first guard and capturing and guiding the chemical liquid to a second flow space in communication with the recovery piping.

With the present method, the flow destination of the chemical liquid expelled from the substrate can be switched from the drain piping to the recovery piping by switching the guard, disposed at the chemical liquid capturable position, from the first guard to the second guard. The switching of the flow destination of the chemical liquid expelled from the substrate (switching of draining→recovery) can thereby be performed easily.

Also, the flow destination of the chemical liquid expelled from the substrate is switched by making different the guard disposed at the chemical liquid capturable position. Transfer of the foreign matter via a guard to the chemical liquid that does not contain the foreign matter can thus be prevented more effectively in comparison to a case where the flow destination is switched by opening and closing of a valve interposed in a drain piping and a valve interposed in a recovery piping, which is branchingly connected to the drain piping, while making the guard, disposed at the chemical liquid capturable position, be the same.

In the preferred embodiment of the present invention, the foreign matter detecting step includes an imaging step of picking up images of the chemical liquid expelled from the substrate in parallel with the chemical liquid supplying step, and a step where the foreign matter contained in the chemical liquid expelled from the substrate is detected based on a color of the chemical liquid included in the image picked up by the imaging step.

There are cases where the color of the chemical liquid changes in accordance with an amount of the foreign matter contained in the chemical liquid, etc. In such case, by observing a change of the color of the chemical liquid expelled from the substrate, the degree to which the foreign matter is contained in the chemical liquid can be made known.

With the present method, the chemical liquid expelled from the substrate is imaged in parallel with the supplying of the chemical liquid. Then, based on the color of the chemical liquid included in the imaged image, the flow destination of the chemical liquid expelled from the substrate is switched from draining to recovery. Switching of the flow destination in accordance with the degree to which the foreign matter is contained in the chemical liquid expelled from the substrate (switching of draining→recovery) can thereby be realized by a comparatively simple means.

In the preferred embodiment of the present invention, the imaging step includes a step of picking up images of the chemical liquid that is captured by an inner wall of the cylindrical first guard arranged to capture the chemical liquid expelled from the substrate.

With the present method, the chemical liquid captured by the inner wall of the first guard is imaged in parallel with the supplying of the chemical liquid. The inner wall of the first guard and the chemical liquid are included among the imaged objects. If a color of the inner wall of the first guard is a color that is identifiable in contrast to the color of the chemical liquid in a state of containing the foreign matter, then a background color in the imaged image is the "color of the chemical liquid in the state of containing the foreign matter" and therefore the degree to which the foreign matter is contained in the chemical liquid expelled from the substrate can be identified satisfactorily.

The inner wall of the first guard may have a color of high brightness. In this case, the brightness of the background color in the imaged image is high and therefore the degree to which the foreign matter is contained in the chemical liquid expelled from the substrate can be identified even more satisfactorily. The "color of high brightness" includes a white color. The white color includes ivory, cream, off-white, unbleached white, light gray, custard cream, beige, etc.

In the preferred embodiment of the present invention, the imaging step includes a step of picking up images of the chemical liquid present on the main surface of the substrate.

With the present method, the chemical liquid present on the main surface of the substrate is imaged in parallel with the supplying of the chemical liquid. The main surface of the substrate and the chemical liquid are included among the imaged objects. If a color of the main surface of the substrate is a color that is identifiable in contrast to the color of the chemical liquid in the state of containing the foreign matter, then the background color in the imaged image is the "color of the chemical liquid in the state of containing the foreign matter" and therefore the degree to which the foreign matter is contained in the chemical liquid expelled from the substrate can be identified satisfactorily.

In the preferred embodiment of the present invention, the imaging step includes a step of picking up images of the foreign matter contained in the chemical liquid flowing through a first flow space, being in communication with the drain piping and being a flow space, which is provided in an interior of a processing cup surrounding a periphery of the substrate holding unit and through which the chemical liquid expelled from the substrate flows, and/or in the chemical liquid flowing through the drain piping.

With the present method, the chemical liquid flowing through the first flow space and/or the chemical liquid flowing through the drain piping are or is imaged in parallel with the supplying of the chemical liquid. The first flow space and/or the drain piping are or is included among the imaged objects. If a color of an inner wall of the first flow space and/or a color of a pipe wall of the drain piping is a color that is identifiable in contrast to the color of the chemical liquid in the state of containing the foreign matter, then the background color in the imaged image is the "color of the chemical liquid in the state of containing the foreign matter" and therefore the degree to which the foreign matter is contained in the chemical liquid expelled from the substrate can be identified satisfactorily.

In another preferred embodiment of the present invention, the foreign matter detecting step further includes a foreign matter concentration measuring step of measuring a concentration of the foreign matter contained in the chemical liquid expelled from the substrate.

By measuring the concentration of the foreign matter contained in the chemical liquid expelled from the substrate, the degree to which the foreign matter is contained in the chemical liquid can be made known.

With the present method, the concentration in the chemical liquid expelled from the substrate is measured in parallel with the supplying of the chemical liquid. Then, based on the measured concentration, the flow destination of the chemical liquid expelled from the substrate is switched from draining to recovery. The switching between draining and recovery in accordance with the degree to which the foreign matter is contained in the chemical liquid expelled from the substrate can thereby be realized with high precision.

In the other preferred embodiment of the present invention, the foreign matter concentration measuring step includes a step of measuring the concentrations or concentration of the foreign matter contained in the chemical liquid flowing through a first flow space, being in communication with the drain piping and being a flow space, which is provided in an interior of a processing cup surrounding the periphery of the substrate holding unit and through which the chemical liquid expelled from the substrate flows, and/or in the chemical liquid flowing through the drain piping.

With the present method, the concentrations or concentration in the chemical liquid flowing through the first flow space and/or in the chemical liquid flowing through the drain piping are or is measured in parallel with the supplying of the chemical liquid. The degree to which the foreign matter is contained in the chemical liquid expelled from the substrate can thereby be identified satisfactorily.

A resist may be formed on the main surface of the substrate. Also, the chemical liquid supplied to the main surface of the substrate in the chemical liquid supplying step may include SPM.

With the present method, resist residue, contained in the SPM expelled from the substrate, is detected in parallel with the chemical liquid supplying step. Based on the detection of the resist residue, the flow destination of the SPM expelled from the substrate is switched from the drain piping to the recovery piping during the chemical liquid supplying step. The flow destination of the SPM expelled from the substrate can thereby be switched from draining to recovery in accordance with a degree to which the resist residue is contained in the SPM. The flow destination of the SPM expelled from the substrate can thus be switched from draining to recovery at an appropriate timing.

The present invention provides a substrate processing apparatus, including a substrate holding unit, holding a substrate, a rotating unit, arranged to make the substrate, held by the substrate holding unit, rotate around a central axis passing through a central portion of the substrate, a chemical liquid supplying unit, arranged to supply a chemical liquid to the substrate held by the substrate holding unit, a foreign matter detecting unit, arranged to detect foreign matter contained in the chemical liquid expelled from the substrate, a flow destination switching unit, arranged to switch a flow destination of the chemical liquid, expelled from the substrate held by the substrate holding unit, between a drain piping and a recovery piping, and a controller, controlling the rotating unit, the chemical liquid supplying unit, the foreign matter detecting unit, and the flow destination switching unit, and where the controller executes a chemical liquid supplying step of supplying the chemical liquid to a main surface of the substrate by the chemical liquid supplying unit while rotating the substrate around the rotational axis, a foreign matter detecting step of detecting the foreign matter, contained in the chemical liquid expelled from the substrate, by the foreign matter detecting unit in parallel with the chemical liquid supplying step, and a flow destination switching step of switching, based on the detection of the foreign matter by the foreign matter detecting step, the flow destination of the chemical liquid expelled from the substrate from the drain piping to the recovery piping by the flow destination switching unit during the chemical liquid supplying step.

After some time from start of the chemical liquid supplying step, a large amount of the foreign matter becomes contained in the chemical liquid expelled from the substrate. With elapse of time from the start of the chemical liquid supplying step, chemical liquid processing of the substrate progresses and the amount of the foreign matter contained in the chemical liquid expelled from the substrate decreases. Then, when a predetermined time elapses from the start of the chemical liquid supplying step, a state is reached where the foreign matter is not contained in the chemical liquid expelled from the substrate. The expression, "the foreign matter is not contained in the chemical liquid," is intended to include a case where the foreign matter is not contained at all in the chemical liquid, a case where the foreign matter is hardly contained in the chemical liquid, and a case where the amount of the foreign matter contained in the chemical liquid is low.

With the present arrangement, the foreign matter contained in the chemical liquid expelled from the substrate is detected in parallel with the chemical liquid supplying step. Based on the detection of the foreign matter, the flow destination of the chemical liquid expelled from the substrate is switched from the drain piping to the recovery piping during the chemical liquid supplying step. The flow destination of the chemical liquid expelled from the substrate can thereby be switched from draining to recovery in accordance with a degree to which the foreign matter is contained in the chemical liquid. The flow destination of the chemical liquid expelled from the substrate can thus be switched from draining to recovery at an appropriate timing.

In the preferred embodiment of the present invention, the substrate processing apparatus further includes a processing cup, having a cylindrical first guard, capturing and guiding the chemical liquid, expelled from the substrate held by the substrate holding unit, to a first flow space in communication with the drain piping, and a cylindrical second guard, provided separately from the first guard and capturing and guiding the chemical liquid, expelled from the substrate held by the substrate holding unit, to a second flow space in communication with the recovery piping. Also, the flow destination switching unit includes a guard elevating/lowering unit, arranged to elevate and lower each of the first and second guards. Also, the controller executes, in the flow destination switching step, a guard switching step of switching a guard, disposed at a capturable position, at which the chemical liquid expelled from the substrate can be captured, between the first guard and the second guard by the guard elevating/lowering unit.

With the present arrangement, the flow destination of the chemical liquid expelled from the substrate can be switched from the drain piping to the recovery piping by switching the guard, disposed at the chemical liquid capturable position, from the first guard to the second guard. The switching of the flow destination of the chemical liquid expelled from the substrate (switching of draining→recovery) can thereby be performed easily.

Also, the flow destination of the chemical liquid expelled from the substrate is switched by making different the guard disposed at the chemical liquid capturable position. Transfer of the foreign matter via a guard to the chemical liquid that does not contain the foreign matter can thus be prevented more effectively in comparison to a case where the flow destination is switched by opening and closing of a valve interposed in a drain piping and a valve interposed in a recovery piping, which is branchingly connected to the drain piping, while making the guard, disposed at the chemical liquid capturable position, be the same.

In the preferred embodiment of the present invention, the foreign matter detecting unit includes an imaging unit that picks up images of the chemical liquid expelled from the substrate. Also, the controller executes, in the foreign matter detecting step, an imaging step of picking up images of the chemical liquid expelled from the substrate by the imaging unit in parallel with the chemical liquid supplying step, and a step of detecting the foreign matter, contained in the chemical liquid expelled from the substrate, based on a color of the chemical liquid included in the image picked up images by the imaging step.

There are cases where the color of the chemical liquid changes in accordance with an amount of the foreign matter contained in the chemical liquid, etc. In such case, by observing a change of the color of the chemical liquid expelled from the substrate, the degree to which the foreign matter is contained in the chemical liquid can be made known.

With the present arrangement, the chemical liquid expelled from the substrate is imaged in parallel with the supplying of the chemical liquid. Then, based on the color of the chemical liquid included in the imaged image, the flow destination of the chemical liquid expelled from the substrate is switched from draining to recovery. Switching of the flow destination in accordance with the degree to which the foreign matter is contained in the chemical liquid expelled from the substrate (switching of draining→recovery) can thereby be realized by a comparatively simple means.

In the preferred embodiment of the present invention, the substrate processing apparatus further includes a processing cup, having a cylindrical first guard, surrounding a periphery of the substrate processing unit and arranged to capture the chemical liquid expelled from the substrate by an inner wall. Also, the controller executes, in the imaging step, a step of picked up images of the chemical liquid that is captured by the inner wall of the first guard.

With the present arrangement, the chemical liquid captured by the inner wall of the first guard is imaged in parallel with the supplying of the chemical liquid. The inner wall of the first guard and the chemical liquid are included among the imaged objects. If a color of the inner wall of the first guard is a color that is identifiable in contrast to the color of the chemical liquid in a state of containing the foreign matter, then a background color in the imaged image is the "color of the chemical liquid in the state of containing the foreign matter" and therefore the degree to which the foreign matter is contained in the chemical liquid expelled from the substrate can be identified satisfactorily.

The inner wall of the first guard may have a color of high brightness. In this case, the brightness of the background color in the imaged image is high and therefore the degree to which the foreign matter is contained in the chemical liquid expelled from the substrate can be identified even more satisfactorily. The "color of high brightness" includes a white color. The white color includes ivory, cream, off-white, unbleached white, light gray, custard cream, beige, etc.

In the preferred embodiment of the present invention, the controller executes, in the imaging step, a step of picked up images of the chemical liquid present on the main surface of the substrate.

With the present arrangement, the chemical liquid present on the main surface of the substrate is imaged in parallel with the supplying of the chemical liquid. The main surface of the substrate and the chemical liquid are included among the imaged objects. If a color of the main surface of the substrate is a color that is identifiable in contrast to the color of the chemical liquid in the state of containing the foreign matter, then the background color in the imaged image is the "color of the chemical liquid in the state of containing the foreign matter" and therefore the degree to which the foreign matter is contained in the chemical liquid expelled from the substrate can be identified satisfactorily.

In the preferred embodiment of the present invention, the substrate processing apparatus further includes a processing cup, surrounding the periphery of the substrate holding unit and having a first flow space, being in communication with the drain piping and being a flow space, through which the chemical liquid expelled from the substrate flows. Also, the controller executes, in the imaging step, a step of picked up images of the chemical liquid flowing through the first flow space and/or the chemical liquid flowing through the drain piping.

With the present arrangement, the chemical liquid flowing through the first flow space and/or the chemical liquid flowing through the drain piping are or is imaged in parallel with the supplying of the chemical liquid. The first flow space and/or the drain piping are or is included among the imaged objects. If a color of an inner wall of the first flow space and/or a color of a pipe wall of drain piping is a color that is identifiable in contrast to the color of the chemical liquid in the state of containing the foreign matter, then the background color in the imaged image is the "color of the chemical liquid in the state of containing the foreign matter" and therefore the degree to which the foreign matter is contained in the chemical liquid expelled from the substrate can be identified satisfactorily.

In another preferred embodiment of the present invention, the foreign matter detecting unit includes a concentration meter arranged to measure a concentration of the foreign matter contained in the chemical liquid expelled from the substrate. Also, the controller further executes, in the foreign matter detecting step, a foreign matter concentration measuring step of measuring, by the concentration meter, the concentration of the foreign matter contained in the chemical liquid expelled from the substrate.

By measuring the concentration of the foreign matter contained in the chemical liquid expelled from the substrate, the degree to which the foreign matter is contained in the chemical liquid can be made known.

With the present arrangement, the concentration in the chemical liquid expelled from the substrate is measured in parallel with the supplying of the chemical liquid. Then, based on the measured concentration, the flow destination of the chemical liquid expelled from the substrate is switched from draining to recovery. The switching between draining and recovery in accordance with the degree to which the foreign matter is contained in the chemical liquid expelled from the substrate can thereby be realized with high precision.

In the other preferred embodiment of the present invention, a processing cup, surrounding the periphery of the substrate holding unit and having a first flow space, being in communication with the drain piping and being a flow space, through which the chemical liquid expelled from the substrate flows, is further included. Also, the controller executes, in the foreign matter concentration measuring step, a step of measuring the concentrations or concentration of the foreign matter contained in the chemical liquid flowing through the first flow space and/or in the chemical liquid flowing through the drain piping.

With the present arrangement, the concentrations or concentration in the chemical liquid flowing through the first flow space and/or in the chemical liquid flowing through the drain piping are or is measured in parallel with the supplying of the chemical liquid. The degree to which the foreign matter is contained in the chemical liquid expelled from the substrate can thereby be identified satisfactorily.

A resist may be formed on the main surface of the substrate. Also, the chemical liquid supplied to the main surface of the substrate in the chemical liquid supplying step may include SPM.

In the chemical liquid supplying step, the resist formed on the substrate is removed by the SPM. After the start of the chemical liquid supplying step, a large amount of the resist is contained in the SPM expelled from the substrate.

With the present arrangement, the resist residue, contained in the SPM expelled from the substrate, is detected in parallel with the chemical liquid supplying step. Based on the detection of the resist residue, the flow destination of the SPM expelled from the substrate is switched from the drain piping to the recovery piping during the chemical liquid supplying step. The flow destination of the SPM expelled from the substrate can thereby be switched from draining to recovery in accordance with a degree to which the resist residue is contained in the SPM. The flow destination of the SPM expelled from the substrate can thus be switched from draining to recovery at an appropriate timing.

The aforementioned and yet other objects, features, and effects of the present invention will be made clear by the following description of the preferred embodiment with reference to the attached drawings.

BRIEF DESCRIPTION OF THE DRAWINGS

FIG. 12 is a flowchart for describing the guard switching timing in the SPM step according to the second preferred embodiment of the present invention.

DETAILED DESCRIPTION OF PREFERRED EMBODIMENTS

Figure 1:
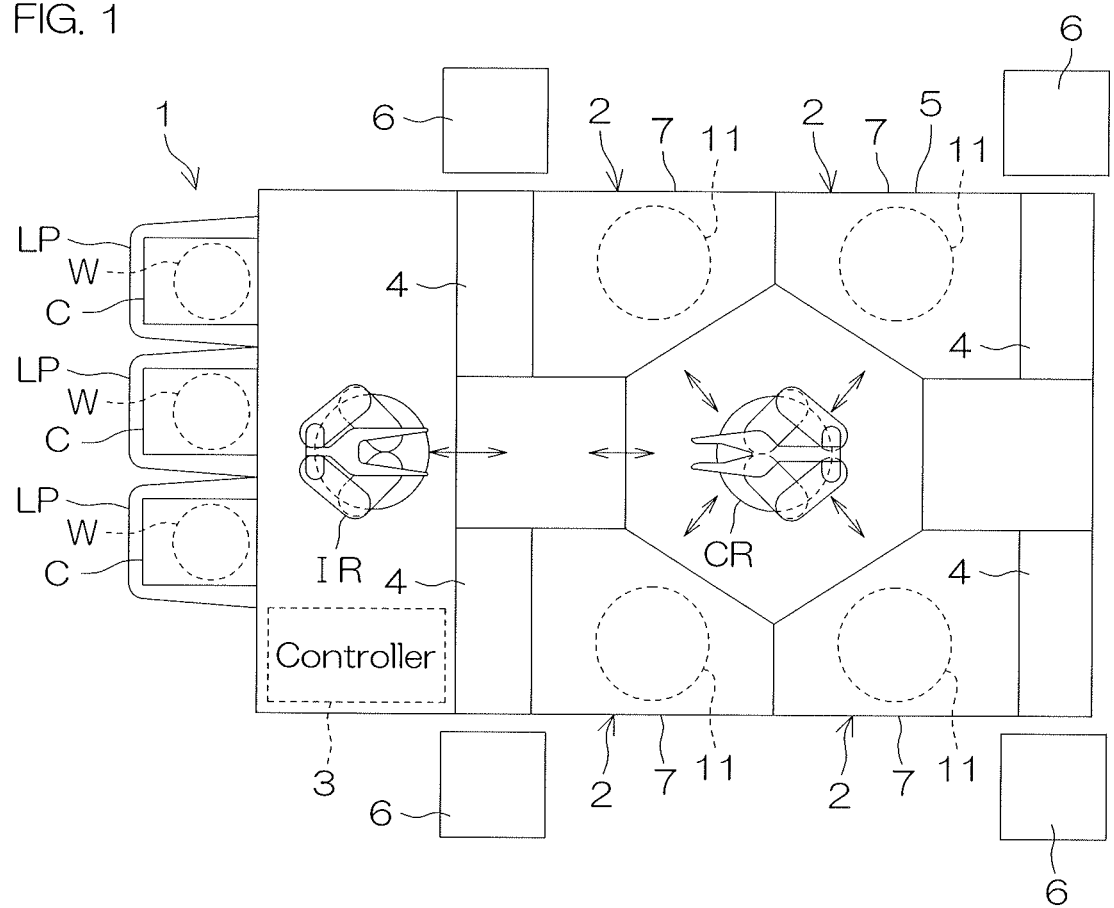
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a preferred embodiment of the present invention. The substrate processing apparatus 1 is a single substrate processing type apparatus that processes disk-shaped substrates W, such as semiconductor wafers, etc., one by one.

The substrate processing apparatus 1 includes a plurality of load ports LP, holding a plurality of substrate containers C housing substrates W, a plurality (for example, twelve) of processing units 2, processing the substrates W transferred from the plurality of load ports LP with processing liquids, such as a chemical liquid, etc., a transfer robot, transferring the substrates W from the plurality of load ports LP to the plurality of processing units 2, and a controller 3, controlling the substrate processing apparatus 1. The transfer robot includes an indexer robot IR, transferring the substrates W on a path between the load ports LP and the processing units 2, and a substrate transfer robot CR, transferring the substrates W on a path between the indexer robot IR and the processing units 2.

The substrate processing apparatus 1 includes a plurality of fluid boxes 4, each housing valves, etc., and storage boxes 6, each housing a sulfuric acid tank 27 (see FIG. 2), storing sulfuric acid, etc. The processing units 2 and the fluid boxes 4 are disposed inside a frame 5 of the substrate processing apparatus 1 and are covered by the frame 5 of the substrate processing apparatus 1. Although the storage boxes 6 are disposed outside the frame 5 of the substrate processing apparatus 1 in the example of FIG. 1, these may be housed inside the frame 5 instead. There may be a single storage box 6 corresponding to the plurality of fluid boxes 4 or a plurality of boxes may be provided in one-to-one correspondence to the fluid boxes 4.

The twelve processing units 2 form four towers disposed such as to surround the substrate transfer robot CR in plan view. Each tower includes three processing units 2 that are stacked up and down. The four storage boxes 6 correspond respectively to the four towers. Similarly, the four fluid boxes 4 correspond respectively to the four towers. The sulfuric acid stored in the sulfuric acid tank 27 inside each storage box 6 is supplied to the three processing units 2 corresponding to the storage box 6 via the fluid box 4 corresponding to the storage box 6.

Figure 2:
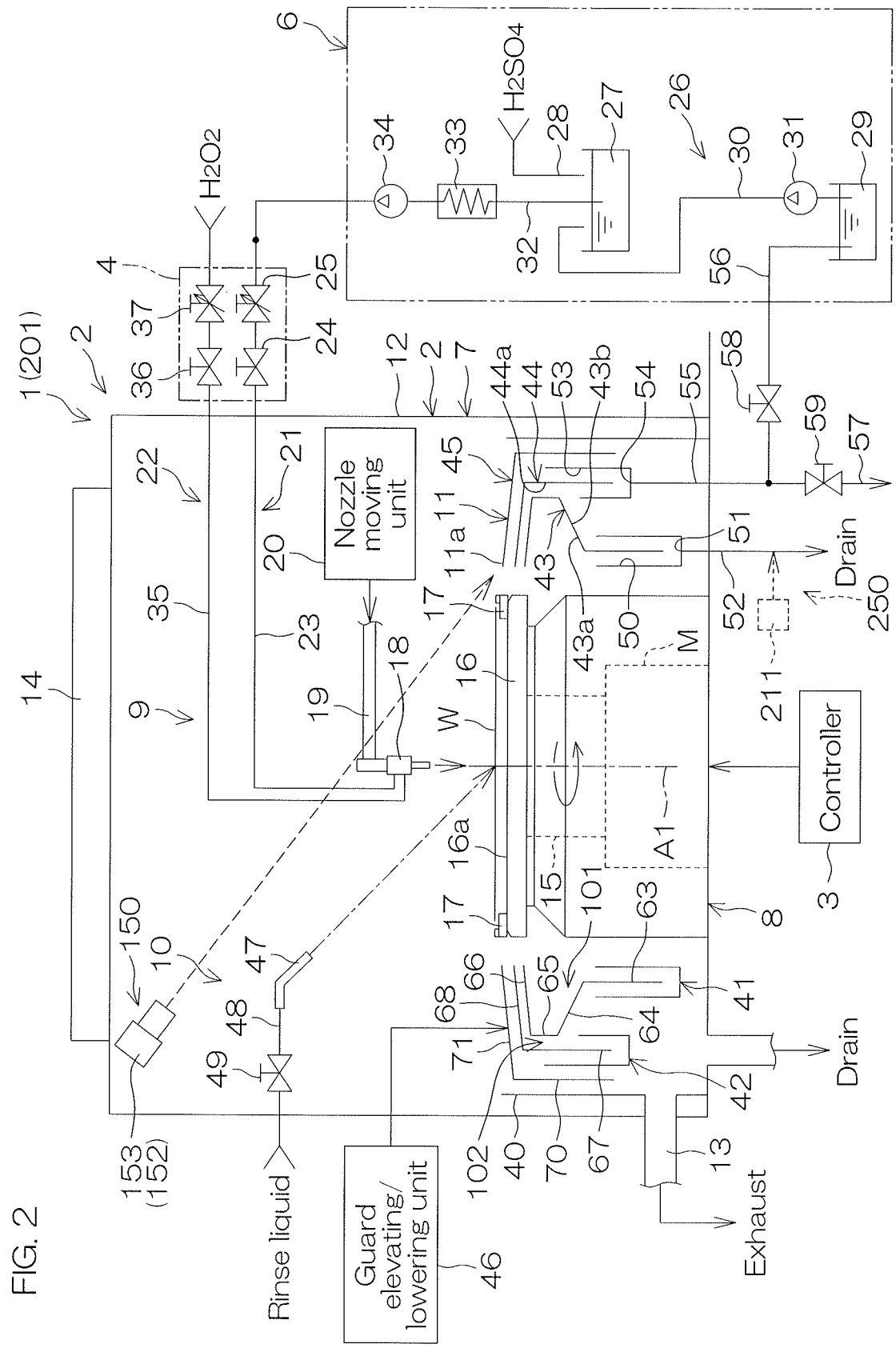
FIG. 2 is an illustrative sectional view for describing an arrangement example of a processing unit included in the substrate processing apparatus.

FIG. 2 is an illustrative sectional view for describing an arrangement example of a processing unit 2.

The processing unit 2 includes a box-shaped chamber 7, having an internal space, a spin chuck (substrate holding unit) 8, holding a single substrate W in a horizontal orientation inside the chamber 7 and rotating the substrate W around a vertical rotational axis A1 passing through a center of the substrate W, an SPM supplying unit (chemical liquid supplying unit) 9, arranged to supply SPM (sulfuric acid/ hydrogen peroxide mixture; a liquid mixture containing $H_2SO_4$ (sulfuric acid) and $H_2O_2$ (hydrogen peroxide water)), as an example of a chemical liquid, to an upper surface of the substrate W held by the spin chuck 8, a foreign matter detecting unit 150, detecting resist residue contained in the SPM expelled from the substrate W, a rinse liquid supplying unit 10, arranged to supply a rinse liquid to the upper surface of the substrate W held by the spin chuck 8, and a cylindrical processing cup 11, surrounding the spin chuck 8.

The chamber 7 includes a box-shaped partition wall 12, an FFU (fan filter unit) 14 as a blower unit sending clean air to inside the partition wall 12 (corresponding to inside the chamber 7) from an upper portion of the partition wall 12, and an exhaust apparatus (not shown), exhausting gas inside the chamber 7 from a lower portion of the partition wall 12.

As shown in FIG. 2, the FFU 14 is disposed above the partition wall 12 and is mounted to a ceiling of the partition wall 12. The FFU 14 sends the clean air to inside the chamber 7 from the ceiling of the partition wall 12. The exhaust apparatus (not shown) is connected to a bottom portion of the processing cup 11 via an exhaust duct 13, connected to inside the processing cup 11, and suctions an interior of the processing cup 11 from the bottom portion of the processing cup 11. A down flow (downward flow) is formed inside the chamber 7 by the FFU 14 and the exhaust apparatus (not shown).

As the spin chuck 8, a clamping type chuck, which clamps the substrate W in horizontal directions to hold the substrate W horizontally, is adopted. Specifically, the spin chuck 8 includes a spin motor (rotating unit) M, a spin shaft 15, made integral to a driveshaft of the spin motor M, and a disk-shaped spin base 16, mounted substantially horizontally on an upper end of the spin shaft 15.

The spin base 16 includes a horizontal, circular upper surface 16a, having an outer diameter greater than an outer diameter of the substrate W. A plurality (not less than three; for example, six) of clamping members 17 are disposed at a peripheral edge portion of the upper surface 16a. At the upper surface peripheral edge portion of the spin base 16, the plurality of clamping members 17 are disposed at suitable intervals, for example, at equal intervals on a circumference corresponding to an outer peripheral shape of the substrate W.

The SPM supplying unit 9 includes an SPM nozzle 18, a nozzle arm 19, having the SPM nozzle 18 mounted on a tip portion, and a nozzle moving unit 20 moving the nozzle arm 19 to move the SPM nozzle 18.

The SPM nozzle 18 is, for example, a straight nozzle that discharges the SPM in a continuous flow state. The SPM nozzle 18 is mounted on the nozzle arm 19, for example, in a perpendicular orientation of discharging the processing liquid in a direction perpendicular to the upper surface of the substrate W. The nozzle arm 19 extends in a horizontal direction.

The nozzle moving unit 20 makes the nozzle arm 19 move horizontally around a swinging axis to move the SPM nozzle 18 horizontally. The nozzle moving unit 20 makes the SPM nozzle 18 move horizontally between a processing position, at which the SPM discharged from the SPM nozzle 18 lands on the upper surface of the substrate W, and a retreat position, at which the SPM nozzle 18 is set at a periphery of the spin chuck 8 in plan view. In the present preferred embodiment, the processing position is, for example, a central position, at which the SPM discharged from the SPM nozzle 18 lands at an upper surface central portion of the substrate W.

The SPM supplying unit 9 further includes a sulfuric acid supplying unit 21, supplying $H_2SO_4$ to the SPM nozzle 18, and a hydrogen peroxide water supplying unit 22, supplying $H_2O_2$ to the SPM nozzle 18.

The sulfuric acid supplying unit 21 includes a sulfuric acid piping 23, having one end connected to the SPM nozzle 18, a sulfuric acid valve 24, arranged to open and close the sulfuric acid piping 23, a sulfuric acid flow control valve 25, adjusting an opening degree of the sulfuric acid piping 23 to adjust a flow rate of the $H_2SO_4$ flowing through the sulfuric acid piping 23, and a sulfuric acid supply portion 26, to which the other end of the sulfuric acid piping 23 is connected. The sulfuric acid valve 24 and the sulfuric acid flow control valve 25 are housed inside a fluid box 4. The sulfuric acid supply portion 26 is housed in a storage box 6.

The sulfuric acid flow control valve 25 includes a valve body, with a valve seat provided in its interior, a valve element, opening and closing the valve seat, and an actuator, moving the valve element between an open position and a closed position. The same also applies to other flow control valves.

The sulfuric acid supply portion 26 includes a sulfuric acid tank 27, storing the $H_2SO_4$ to be supplied to the sulfuric acid piping 23, a sulfuric acid replenishing piping 28, replenishing fresh $H_2SO_4$ to the sulfuric acid tank 27, a recovery tank 29, a liquid feeding piping 30, arranged to feed the $H_2SO_4$ stored in the recovery tank 29 to the sulfuric acid tank 27, a first liquid feeding apparatus 31, moving the $H_2SO_4$ inside the recovery tank 29 to the liquid feeding piping 30, a sulfuric acid supply piping 32, connecting the sulfuric acid tank 27 and the sulfuric acid piping 23, a temperature controller 33, heating and thereby performing temperature control of the sulfuric acid flowing through the sulfuric acid supply piping 32, and a second liquid feeding apparatus 34, moving the $H_2SO_4$ inside the sulfuric acid tank 27 to the sulfuric acid supply piping 32. The temperature controller 33 may be immersed inside the $H_2SO_4$ in the sulfuric acid tank 27 or may be interposed at an intermediate portion of the sulfuric acid supply piping 32 as shown in FIG. 2. Also, the sulfuric acid supply portion 26 may further includes a filter, filtering the sulfuric acid flowing through the sulfuric acid supply piping 32, and/or a thermometer, measuring a temperature of the sulfuric acid flowing through the sulfuric acid supply piping 32. Although in the present preferred embodiment, the sulfuric acid supply portion 26 has two tanks, the arrangement of the recovery tank 29 may be omitted and an arrangement, with which the sulfuric acid recovered from the processing cup 11 is supplied directly to the sulfuric acid tank 27, may be adopted instead. The first and second liquid feeding apparatuses 31 and 34 are, for example, pumps. A pump draws in the $H_2SO_4$ inside the sulfuric acid tank 27 and discharges the drawn-in $H_2SO_4$.

The hydrogen peroxide water suppling unit 22 includes a hydrogen peroxide water piping 35, connected to the SPM nozzle 18, a hydrogen peroxide water valve 36, arranged to open and close the hydrogen peroxide water piping 35, and a hydrogen peroxide water flow control valve 37, adjusting an opening degree of the hydrogen peroxide water valve 36 to adjust a flow rate of the $H_2O_2$ flowing through the hydrogen peroxide water valve 36. The hydrogen peroxide water valve 36 and the hydrogen peroxide water flow control valve 37 are housed inside the fluid box 4. $H_2O_2$, which is approximately of ordinary temperature (approximately 23° C.) and is not temperature-controlled, is supplied from a hydrogen peroxide water supply source, housed in the storage box 6, to the hydrogen peroxide water piping 35.

When the sulfuric acid valve 24 and the hydrogen peroxide water valve 36 are opened, the $H_2SO_4$ from the sulfuric acid piping 23 and the $H_2O_2$ from the hydrogen peroxide water piping 35 are supplied to inside a casing (not shown) of the SPM nozzle 18 and are mixed (stirred) sufficiently inside the casing. By the mixing, the $H_2SO_4$ and the $H_2O_2$ are mixed uniformly, and the liquid mixture (SPM) of the $H_2SO_4$ and the $H_2O_2$ is formed by reaction of the $H_2SO_4$ and the $H_2O_2$. The SPM contains peroxomonosulfuric acid ($H_2SO_5$) of strong oxidizing power and is temperature-raised to a temperature (of not less than 100° C.; for example, 160 to 220° C.) higher than the temperatures of the $H_2SO_4$ and the $H_2O_2$ before mixing. The high-temperature SPM that is formed is discharged from a discharge port opening at a tip (for example, a lower end) of the casing of the SPM nozzle 18.

An $H_2SO_4$ concentration of the SPM discharged from the SPM nozzle 18 can be adjusted within a predetermined range by adjusting the opening degrees of the sulfuric acid piping 23 and the hydrogen peroxide water piping 35 by the sulfuric acid flow control valve 25 and the hydrogen peroxide water flow control valve 37. The $H_2SO_4$ concentration (mixing ratio) of the SPM discharged from the SPM nozzle 18 is adjusted within a flow rate ratio range of $H_2SO_4$:$H_2O_2$=20:1 (a high concentration state rich in sulfuric acid) to 2:1 (a low concentration state rich in hydrogen peroxide water) and more preferably within a range of $H_2SO_4$:$H_2O_2$=10:1 to 5:1.

The sulfuric acid supply portion 26 reuses the SPM, recovered from the processing cup 11, as $H_2SO_4$. The SPM recovered from the processing cup 11 is supplied to the recovery tank 29 and stored in the recovery tank 29. With the elapse of time, the $H_2O_2$ contained in the SPM decomposes and the SPM stored in the recovery tank 29 changes to sulfuric acid. However, the sulfuric acid that changed from the SPM contains a large amount of water and must thus be adjusted in concentration. In the sulfuric acid supply portion 26, the $H_2SO_4$ inside the recovery tank 29 is fed to the sulfuric acid tank 27 and adjusted in concentration in the sulfuric acid tank 27. The SPM is thereby reused as $H_2SO_4$.

The rinse liquid supplying unit 10 includes a rinse liquid nozzle 47. The rinse liquid nozzle 47 is, for example, a straight nozzle that discharges a liquid in a continuous flow state and is disposed fixedly above the spin chuck 8 with its discharge port directed toward the upper surface central portion of the substrate W. A rinse liquid piping 48, to which the rinse liquid from a rinse liquid supply source is supplied, is connected to the rinse liquid nozzle 47. A rinse liquid valve 49, arranged to switch between supplying and stopping the supply of the rinse liquid from the rinse liquid nozzle 47, is interposed in an intermediate portion of the rinse liquid piping 48. When the rinse liquid valve 49 is opened, the rinse liquid supplied from the rinse liquid piping 48 to the rinse liquid nozzle 47 is discharged from the discharge port set at a lower end of the rinse liquid nozzle 47. Also, when the rinse liquid valve 49 is closed, the supply of the rinse liquid from the rinse liquid piping 48 to the rinse liquid nozzle 47 is stopped. The rinse liquid is, for example, deionized water (DIW), but is not restricted to DIW and may instead be any of carbonated water, electrolyzed ion water, hydrogen water, ozone water, ammonia water, and aqueous hydrochloric acid solution of dilute concentration (for example, approximately 10 ppm to 100 ppm). The rinse liquid may be used at ordinary temperature or may be heated and used as hot water.

Also, the rinse liquid supplying unit 10 may include a rinse liquid nozzle moving apparatus that moves the rinse liquid nozzle 47 to make a liquid landing position of the rinse liquid with respect to the upper surface of the substrate W be scanned within a surface of the substrate W.

The processing cup 11 is disposed further outward (in directions away from the rotational axis A1) than the substrate W held by the spin chuck 8. The processing cup 11 is formed using, for example, an insulating material. The processing cup 11 surrounds lateral sides of the spin base 16. When in a state where the spin chuck 8 rotates the substrate W, a processing liquid is supplied to the substrate W, the processing liquid supplied to the substrate W is spun off to a periphery of the substrate W. When the processing liquid is supplied to the substrate W, an upper end portion 11a of the upwardly-open processing cup 11 is disposed higher than the spin base 16. Therefore, the processing liquid, such as the chemical liquid, water, etc., expelled to the periphery of the substrate W is received by the processing cup 11. The processing liquid received by the processing cup 11 is fed to the recovery tank 29 or an unillustrated draining apparatus.

The processing cup 11 includes a circular cylindrical member 40, a plurality of cups (first and second cups 41 and 42) disposed fixedly such as to doubly surround the spin chuck 8 at an inner side of the circular cylindrical member 40, a plurality of guards (first, second, and third guards 43, 44, and 45), arranged to receive the processing liquid (the chemical liquid or the rinse liquid) that scattered to the periphery of the substrate W, and a guard elevating/lowering unit (flow destination switching unit) 46, elevating and lowering each of the guards independently. The guard elevating/lowering unit 46 has an arrangement that includes, for example, a ball-screw mechanism.

The processing cup 11 is collapsible, and deployment or collapsing of the processing cup 11 is performed by the guard elevating/lowering unit 46 elevating or lowering at least one of the three guards.

The first cup 41 has a circular annular shape and, at a position between the spin chuck 8 and the circular cylindrical member 40, surrounds the periphery of the spin chuck 8. The first cup 41 has a shape that is substantially rotationally symmetric with respect to the rotational axis A1 of the substrate W. The first cup 41 has a U-shaped cross section and demarcates a first groove 50, arranged to collect and drain the processing liquid used to process the substrate W. A drain port 51 is opened at a lowest location of a bottom portion of the first groove 50 and a first drain piping 52 is connected to the drain port 51. The processing liquid led into the first drain piping 52 is fed to a draining apparatus (not shown; may be a waste liquid apparatus) and processed by this apparatus.

The second cup 42 has a circular annular shape and surrounds a periphery of the first cup 41. The second cup 42 has a shape that is substantially rotationally symmetric with respect to the rotational axis A1 of the substrate W. The second cup 42 has a U-shaped cross section and demarcates a second groove 53, arranged to collect and recover the processing liquid used to process the substrate W. A drain/recovery port 54 is opened at a lowest location of a bottom portion of the second groove 53 and a common piping 55 is connected to the drain/recovery port 54. A recovery piping 56 and a second drain piping 57 are respectively branchingly connected to the common piping 55. The other end of the recovery piping 56 is connected to the recovery tank 29 of the sulfuric acid supply portion 26. A recovery valve 58 is interposed in the recovery piping 56 and a drain valve 59 is interposed in the second drain piping 57. By the recovery valve 58 being opened with the drain valve 59 being closed, the liquid flowing through the common piping 55 is led to the recovery piping 56. Also, by the drain valve 59 being opened with the recovery valve 58 being closed, the liquid flowing through the common piping 55 is led to the second drain piping 57. That is, the recovery valve 58 and the drain valve 59 function as a switching unit that switches a flow destination of the liquid, flowing through the common piping 55, between the recovery piping 56 and the second drain piping 57. The second drain piping 57 is exclusively used, when cleaning an inner wall 44a of the second guard 44, the second cup 42, and the common piping 55, to discard a cleaning liquid used for cleaning.

The innermost first guard 43 surrounds the periphery of the spin chuck 8 and has a substantially rotationally symmetric shape with respect to the axis A1 of rotation of the substrate W by the spin chuck 8. The first guard 43 includes a lower end portion 63 of circular cylindrical shape that surrounds the periphery of the spin chuck 8, a cylindrical portion 64, extending outward (in directions away from the rotational axis A1 of the substrate W) from an upper end of the lower end portion 63, an intermediate portion 65 of circular cylindrical shape that extends vertically upward from an upper surface outer peripheral portion of the cylindrical portion 64, and an upper end portion 66 of circular annular shape extending obliquely upward and inward (in directions of approaching the rotational axis A1 of the substrate W) from an upper end of the intermediate portion 65. The lower end portion 63 is positioned above the first groove 50 and is housed in an interior of the first groove 50 in a state where the first guard 43 and the first cup 41 are disposed closest to each other. An inner peripheral end of the upper end portion 66 defines a circle with a diameter greater than the substrate W, held by the spin chuck 8, in plan view. Also, a cross-sectional shape of the upper end portion 66 may be rectilinear as shown in FIG. 2, or may, for example, extend in a smooth, circular arc.

The first guard 43 is formed using, for example, a chemical-resistant resin material (for example, a fluororesin, such as PFA (tetrafluoroethylene-perfluoroalkylvinyl ether copolymer), PCTFE (polychlorotrifluoroethylene), or PTFE (polytetrafluoroethylene), etc.). An entirety of the first guard 43, including an inner wall 43*a*, has a white color. The white color includes ivory, cream, off-white, unbleached white, light gray, custard cream, beige, etc.

The second innermost second guard 44 surrounds the periphery of the spin chuck 8 at an outer side of the first guard 43 and has a substantially rotationally symmetric shape with respect to the axis A1 of rotation of the substrate W by the spin chuck 8. The second guard 44 includes a circular cylindrical portion 67, coaxial to the first guard 43, and an upper end portion 68, extending obliquely upward and toward the center (in directions of approaching the rotational axis A1 of the substrate W) from an upper end of the circular cylindrical portion 67. An inner peripheral end of the upper end portion 68 defines a circle with a diameter greater than the substrate W, held by the spin chuck 8, in plan view. A cross-sectional shape of the upper end portion 68 may be rectilinear as shown in FIG. 2, or may, for example, extend in a smooth, circular arc. A tip of the upper end portion 68 demarcates an opening of the upper end portion 11*a* of the processing cup 11.

The circular cylindrical portion 67 is disposed above the second groove 53. Also, the upper end portion 68 is provided such as to overlap with the upper end portion 66 of the first guard 43 in an up-down direction and is formed such as to be disposed close to the upper end portion 66 while maintaining a minute gap with respect thereto in a state where the first guard 43 and the second guard 44 are disposed closest to each other.

The second guard 44 is formed using, for example, a chemical-resistant resin material (for example, a fluororesin, such as PFA (tetrafluoroethylene-perfluoroalkylvinyl ether copolymer), PCTFE (polychlorotrifluoroethylene), or PTFE (polytetrafluoroethylene), etc.). An entirety of the second guard 44, including the inner wall 44*a*, has a white color. The white color includes ivory, cream, off-white, unbleached white, light gray, custard cream, beige, etc.

The outermost third guard 45 surrounds the periphery of the spin chuck 8 at an outer side of the second guard 44 and has a substantially rotationally symmetric shape with respect to the axis A1 of rotation of the substrate W by the spin chuck 8. The third guard 45 includes a circular cylindrical portion 70, coaxial to the second guard 44, and an upper end portion 71, extending obliquely upward and toward the center (in directions of approaching the rotational axis A1 of the substrate W) from an upper end of the circular cylindrical portion 70. An inner peripheral end of the upper end portion 71 defines a circle with a diameter greater than the substrate W, held by the spin chuck 8, in plan view. A cross-sectional shape of the upper end portion 71 may be rectilinear as shown in FIG. 2, or may, for example, extend in a smooth, circular arc.

The third guard 45 is formed using, for example, a chemical-resistant resin material (for example, a fluororesin, such as PFA (tetrafluoroethylene-perfluoroalkylvinyl ether copolymer), PCTFE (polychlorotrifluoroethylene), or PTFE (polytetrafluoroethylene), etc.). An entirety of the third guard 45, including an inner wall, has a white color. The white color includes ivory, cream, off-white, unbleached white, light gray, custard cream, beige, etc.

With the present preferred embodiment, a first flow space (in other words, a drain space) 101, through which the chemical liquid used to process the substrate W is guided, is demarcated by the first groove 50 of the first cup 41, the inner wall 43*a* of the first guard 43, and an outer periphery of a casing of the spin chuck 8.

Also, a second flow space (in other words, a recovery space) 102, through which the chemical liquid used to process the substrate W is guided, is demarcated by the second groove 53 of the second cup 42, an outer wall 43*b* of the first guard 43, and the inner wall 44*a* of the second guard 44. The first flow space 101 and the second flow space 102 are separated from each other.

The guard elevating/lowering unit 46 elevates and lowers each of the guards 43 to 45 between an upper position, at which the upper end portion of the guard is positioned higher than the substrate W, and a lower position, at which the upper end portion of the guard is positioned lower than the substrate W. The guard elevating/lowering unit 46 is capable of holding each of the guards 43 to 45 at any position between the upper position and the lower position. The supplying of the processing liquid to the substrate W and the drying of the substrate W are performed in a state where any of the guards 43 to 45 faces a peripheral end surface of the substrate W (in a state where any of the guards is disposed at a capturable position).

In a first guard facing state of the processing cup 11 (see FIG. 6A), in which the innermost first guard 43 is made to face the peripheral end surface of the substrate W, all of the first to third guards 43 to 45 are disposed at the upper positions. In a second guard facing state of the processing cup 11 (see FIG. 6B), in which the second innermost second guard 44 is made to face the peripheral end surface of the substrate W, the second and third guards 44 and 45 are disposed at the upper positions and the first guard 43 is disposed at the lower position. In a third guard facing state of the processing cup 11 (see FIG. 6C), in which the outermost third guard 45 is made to face the peripheral end surface of the substrate W, the third guard 45 is disposed at the upper position and the first and second guards 43 and 44 are disposed at the lower positions. In a retreated state (see FIG. 2), in which all of the guards are retreated from the peripheral end surface of the substrate W, all of the first to third guards 43 to 45 are disposed at the lower positions.

The foreign matter detecting unit 150 includes an imaging unit 152 that picks up images of the SPM expelled from the substrate W. The foreign matter detecting unit 150 detects the resist residue contained in the SPM expelled from the substrate W based on a color of the chemical liquid included in an image picked up by the imaging unit 152. In addition to the imaging unit 152, the foreign matter detecting unit 150 includes an image processing portion 3B and an imaging controller 3C of the controller 3 to be described below.

The imaging unit 152 includes a camera 153 and a light source (not shown). The camera 153 includes a lens, an imaging element, converting an optical image formed by the lens to an electrical signal, and an imaging circuit, generating an image signal based on the electrical signal resulting from the conversion and transmitting the image signal to the image processing portion 3B (see FIG. 3) of the controller 3. The imaging element includes a CCD image sensor or a CMOS image sensor, etc. The camera 153 may be a high-speed camera capable of picking up images at a rate of several thousand to several ten thousand images per second or may be a general camera capable of picking up images at a rate of approximately ten to one hundred images per second. The imaged image is not restricted to a still image and may be a moving image. The camera 153 is disposed at a position at which it can pick up of images the inner wall 43a of the first guard 43 at the upper position (more specifically, an inner wall of the cylindrical portion 64 of the first guard 43) (see also FIG. 6A).

The light source illuminates the inner wall 43a of the first guard 43 at the upper position (more specifically, the inner wall 43a of the cylindrical portion 64 of the first guard 43). The light source is, for example, a light source of white light.

Figure 3:
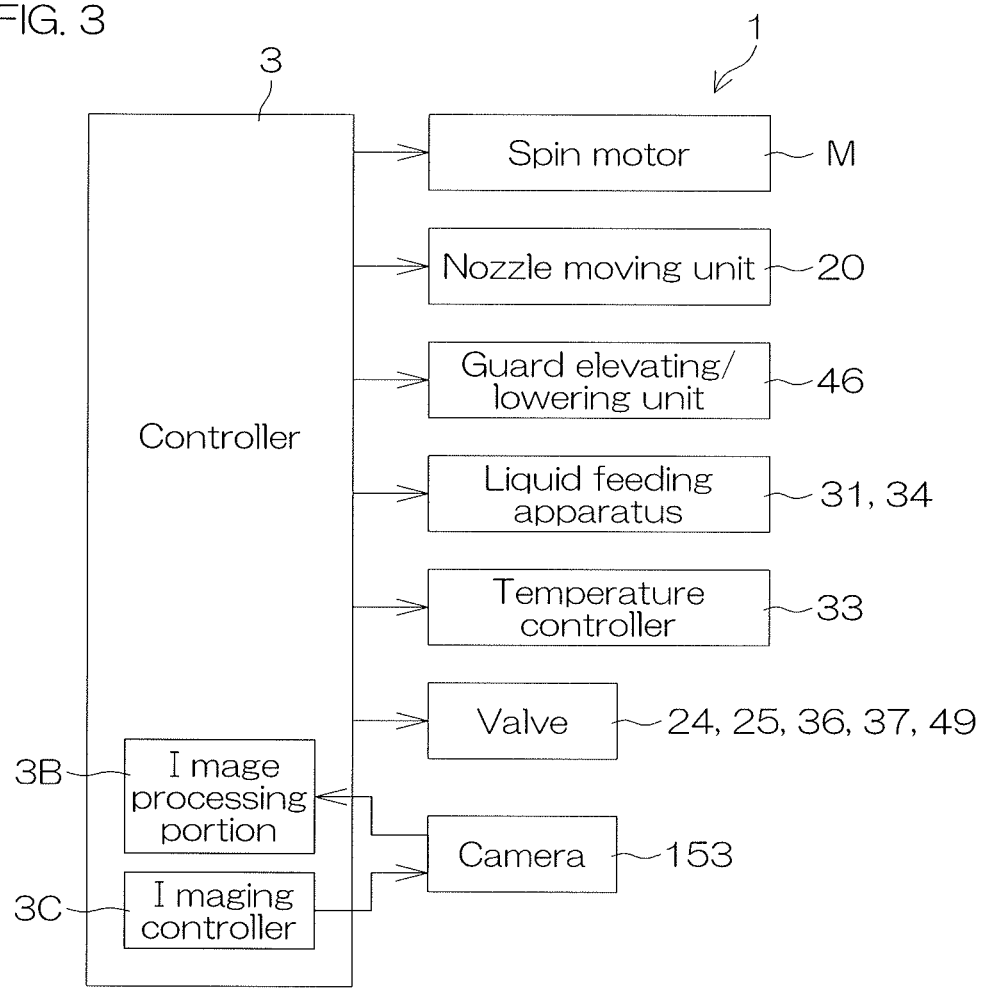
FIG. 3 is a block diagram for describing an electrical configuration of a main portion of the substrate processing apparatus.

FIG. 3 is a block diagram for describing an electrical configuration of a main portion of the substrate processing apparatus 1.

The controller 3 is arranged using, for example, a microcomputer. The controller 3 has a computing unit, such as CPU, etc., a storage unit, such as a fixed memory device, a hard disk drive, etc., and an input/output unit. The storage unit includes a computer-readable recording medium, recording a computer program executed by the computing unit. A step group is incorporated in the recording medium such as to make the controller 3 execute a resist removing processing to be described below.

The controller 3 controls operations of the spin motor M, the nozzle moving unit 20, the guard elevating/lowering unit 46, the first and second liquid feeding apparatuses 31 and 34, the temperature controller 33, etc., in accordance with a predetermined program. Also, the controller 3 controls opening/closing operations of the sulfuric acid valve 24, the hydrogen peroxide water valve 36, the rinse liquid valve 49, etc., in accordance with the predetermined program. Also, the controller 3 adjusts opening degrees of the sulfuric acid flow control valve 25 and the hydrogen peroxide water flow control valve 37 in accordance with the predetermined program.

The controller 3 includes the image processing portion 3B and the imaging controller 3C. These functional processing portions are realized, for example, in software by execution of a predetermined program processing. The camera 153 is connected to the controller 3. The imaging controller 3C controls imaging operations of the camera 153. The image signal from the camera 153 is input into the image processing portion 3B. The image processing portion 3B performs image processing based on the image signal. Specifically, the image processing portion 3B extracts a portion, corresponding to the SPM expelled from the substrate W, from the imaged image and examines colors of pixels of the portion.

Figure 4:
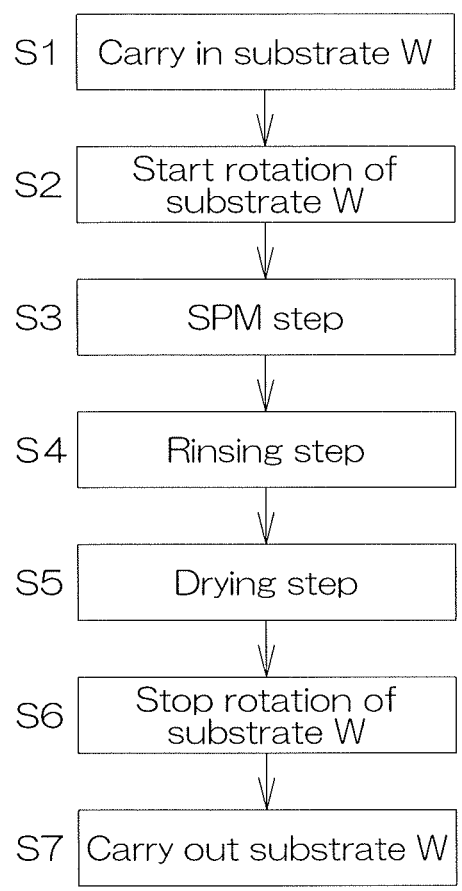
FIG. 4 is a flowchart for describing an example of substrate processing by the processing unit.

FIG. 4 is a flowchart for describing an example of substrate processing by the processing unit 2. The substrate processing example shall now be described with reference to FIG. 1 to FIG. 4.

The present substrate processing example is a resist removing processing of removing a resist from the upper surface (main surface) of a substrate W. The resist has a resin (polymer), a photosensitizer, an additive, and a solvent as main components. When the substrate processing example is to be applied to the substrate W by the processing unit 2, the substrate W that has been subject to high-dose ion implantation processing is carried into an interior of the chamber 7 (S1 of FIG. 4). The substrate W shall be one that has not been subject to processing for ashing the resist.

In a state where all of the nozzles, etc., are retreated from above the spin chuck 8, the controller 3 makes a hand of the substrate transfer robot CR (see FIG. 1) that holds the substrate W enter into the interior of the chamber 7 to thereby make the substrate W be delivered, in a state where its front surface (device forming surface) faces upward, to the spin chuck 8 and be held by the spin chuck 8 (substrate holding step).

The controller 3 starts the rotation of the substrate W by the spin motor M (S2 of FIG. 4; substrate rotating step). The substrate W is raised in rotational speed to a predetermined liquid processing speed (within a range of 300 to 1500 rpm and of, for example, 500 rpm) and maintained at the liquid processing speed.

When the rotational speed of the substrate W reaches the liquid processing speed, the controller 3 executes an SPM step (chemical liquid supplying step) S3.

Specifically, the controller 3 controls the nozzle moving unit 20 to move the SPM nozzle 18 from the retreat position to the processing position. Also, the controller 3 opens the sulfuric acid valve 24 and the hydrogen peroxide water valve 36 at the same time. Thereby, $H_2SO_4$ is supplied to the SPM nozzle 18 through the sulfuric acid piping 23 and $H_2O_2$ is supplied to the SPM nozzle 18 through the hydrogen peroxide water piping 35. The $H_2SO_4$ and the $H_2O_2$ are mixed in an interior of the SPM nozzle 18 and SPM of high temperature (for example, 160 to 220° C.) is formed. The SPM is discharged from the discharge port of the SPM nozzle 18 and lands on the upper surface central portion of the substrate W. With the present preferred embodiment, the concentration of the SPM is maintained fixed throughout an entire period of the SPM step S3.

After landing on the upper surface of the substrate W, the SPM discharged from the SPM nozzle 18 flows outward along the upper surface of the substrate W due to a centrifugal force. The SPM is thus supplied to the entire upper surface of the substrate W and a liquid film of the SPM covering the entire upper surface of the substrate W is formed on the substrate W. Thereby, the resist and the SPM react chemically and the resist on the substrate W is removed from the substrate W by the SPM. The SPM that moved to a peripheral edge portion of the substrate W scatters toward lateral sides of the substrate W from the peripheral edge portion of the substrate W.

Also, in the SPM step S3, the controller 3 may control the nozzle moving unit 20 to move the SPM nozzle 18 between a peripheral edge position of facing a peripheral edge portion of the upper surface of the substrate W and a central position of facing the central portion of the upper surface of the substrate W instead. In this case, a liquid landing position of the SPM on the upper surface of the substrate W is scanned across the entire upper surface of the substrate W. The entire upper surface of the substrate W can thereby be processed uniformly.

When a predetermined period elapses from start of discharge of the SPM, the controller 3 closes the sulfuric acid valve 24 and the hydrogen peroxide water valve 36 to stop the discharge of the SPM from the SPM nozzle 18. The SPM step S3 thereby ends. Thereafter, the controller 3 controls the nozzle moving unit 20 (see FIG. 2) to return the SPM nozzle 18 to the retreat position.

Next, a rinsing step (S4 of FIG. 4) of supplying the rinse liquid to the substrate W is performed. Specifically, the controller 3 opens the rinse liquid valve 49 to make the rinse liquid be discharged from the rinse liquid nozzle 47 toward the upper surface central portion of the substrate W. The rinse liquid discharged from the rinse liquid nozzle 47 lands on the upper surface central portion of the substrate W that is covered by the SPM. The rinse liquid that landed on the upper surface central portion of the substrate W receives the centrifugal force due to the rotation of the substrate W and flows on the upper surface of the substrate W toward the peripheral edge portion of the substrate W. The SPM on the substrate W is thereby washed away outwardly by the rinse liquid and expelled to the periphery of the substrate W. The SPM and the resist (that is, the resist residue) are thereby rinsed off across the entire upper surface of the substrate W. The resist residue is, for example, carbonized matter. When a predetermined period elapses from start of the rinsing step S4, the controller 3 closes the rinse liquid valve 49 to stop the discharge of the rinse liquid from the rinse liquid nozzle 47.

Next, a drying step (S5 of FIG. 4) of drying the substrate W is performed.

Specifically, in the drying step S5, the controller 3 controls the spin motor M to accelerate the substrate W to a drying rotational speed (of, for example, several thousand rpm) that is greater than the rotational speed up to the SPM step S3 and the rinsing step S4 and rotate the substrate W at the drying rotational speed. A large centrifugal force is thereby applied to the liquid on the substrate W and the liquid attached to the substrate W is spun off to the periphery of the substrate W. The liquid is thereby removed from the substrate W and the substrate W dries.

Then, when a predetermined time elapses from the point at which high-speed rotation of the substrate W is started, the controller 3 controls the spin motor M to stop the rotation of the substrate W by the spin chuck 8 (S6 of FIG. 4).

Next, the substrate W is carried out from inside the chamber 7 (S7 of FIG. 4). Specifically, the controller 3 makes the hand of the substrate transfer robot CR enter into the interior of the chamber 7. The controller 3 then makes the hand of the substrate transfer robot CR hold the substrate W on the spin chuck 8. Thereafter, the controller 3 makes the hand of the substrate transfer robot CR retreat from inside the chamber 7. The substrate W, with which the resist has been removed from the front surface (device forming surface), is thereby carried out from the chamber 7.

Figure 5:
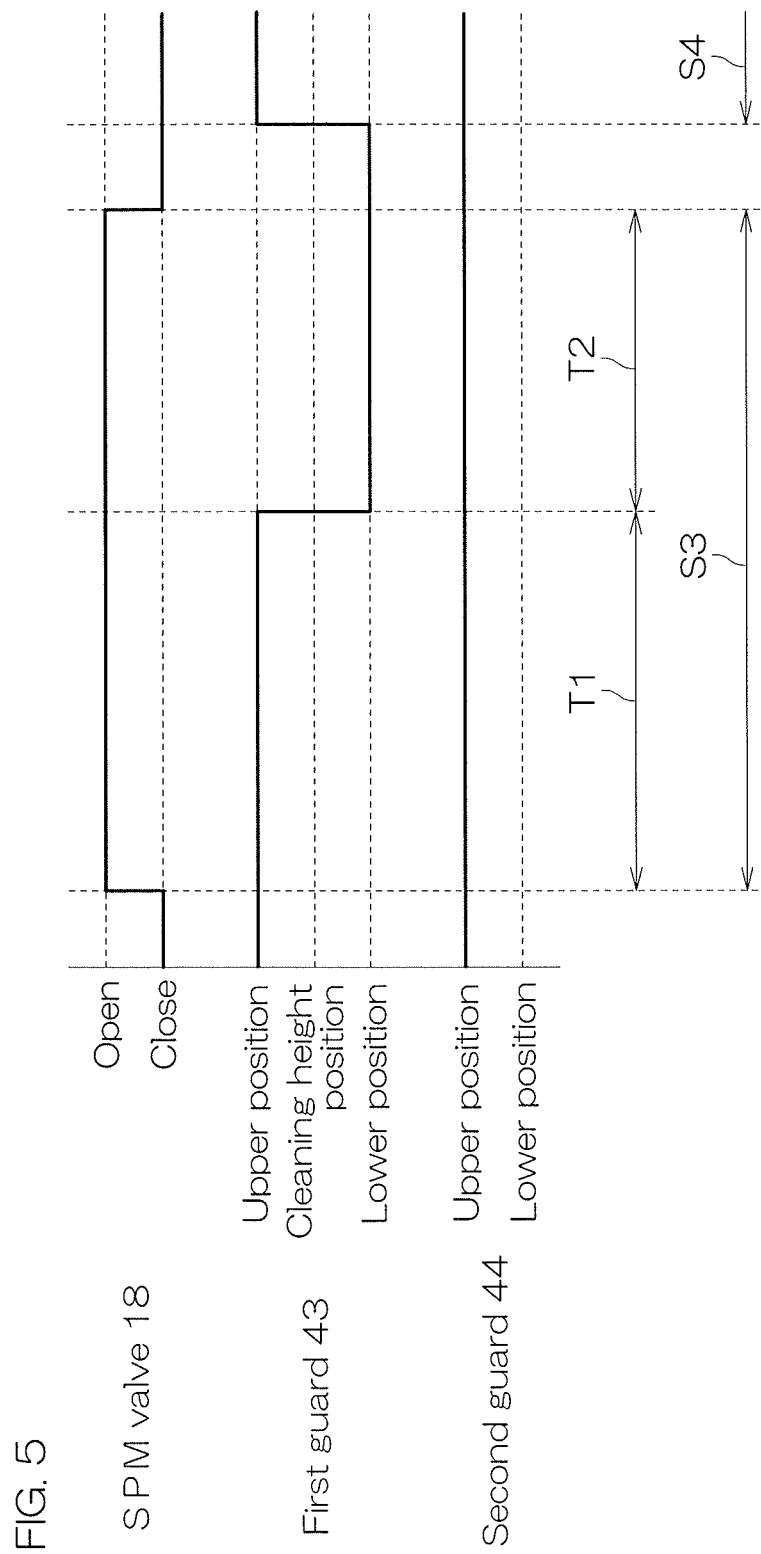
FIG. 5 is a timing chart for describing timings of elevating and lowering guards in an SPM step.
Figure 6A:
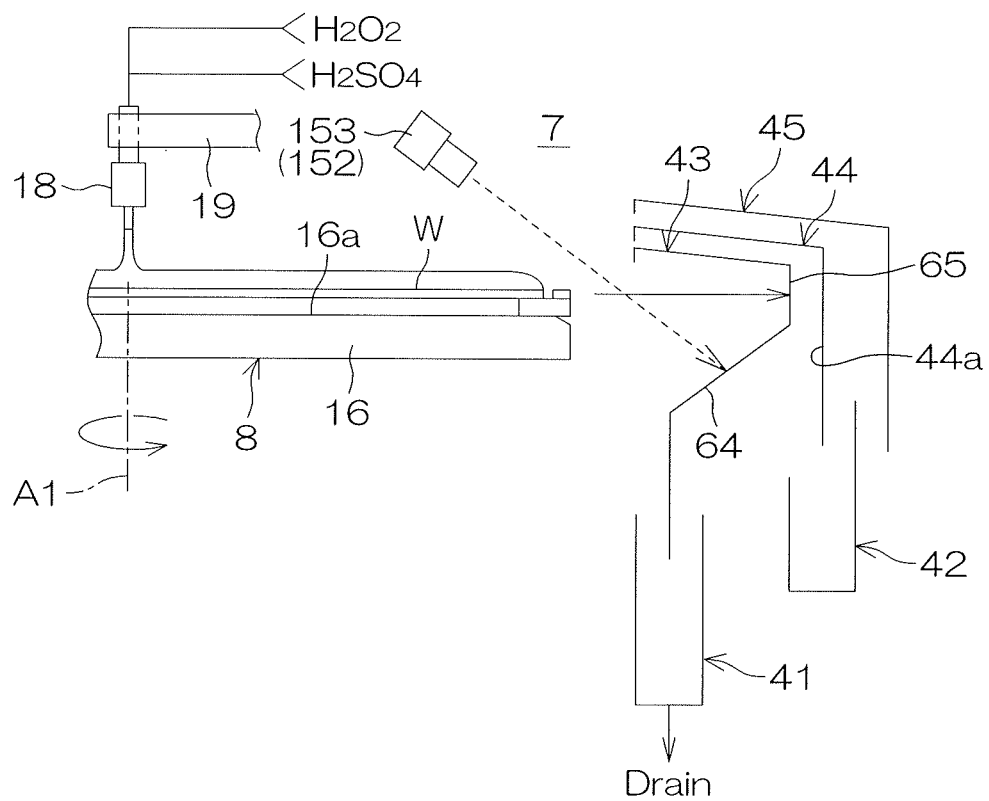
FIGS. 6A and 6B are illustrative diagrams for describing the SPM step.
Figure 6B:
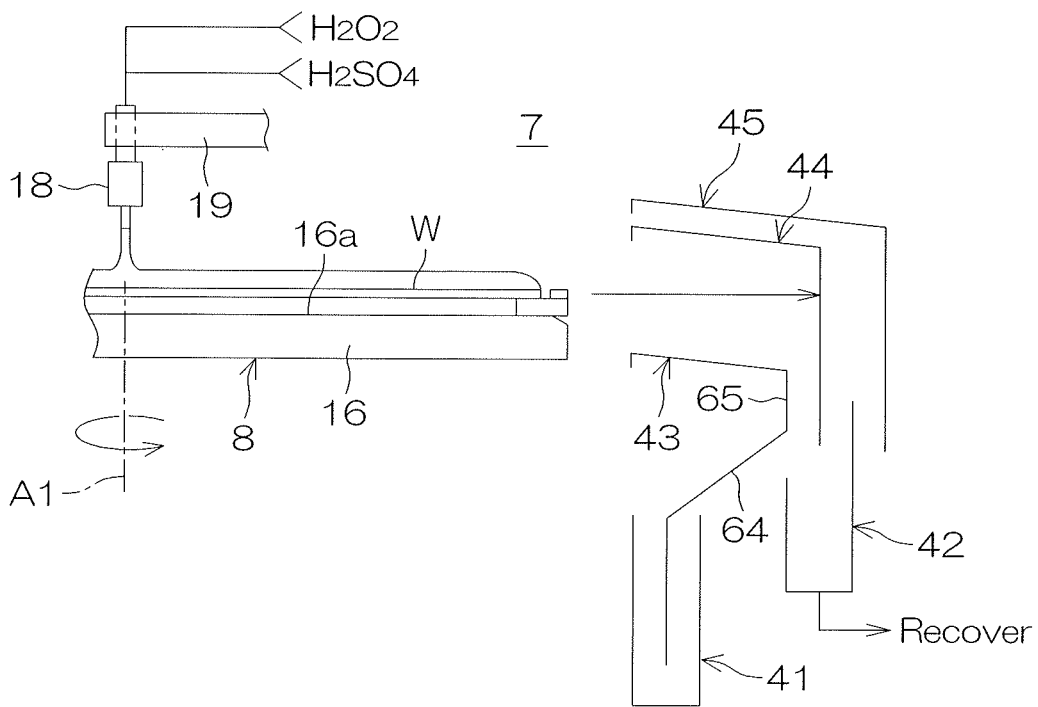
Figure 6C:
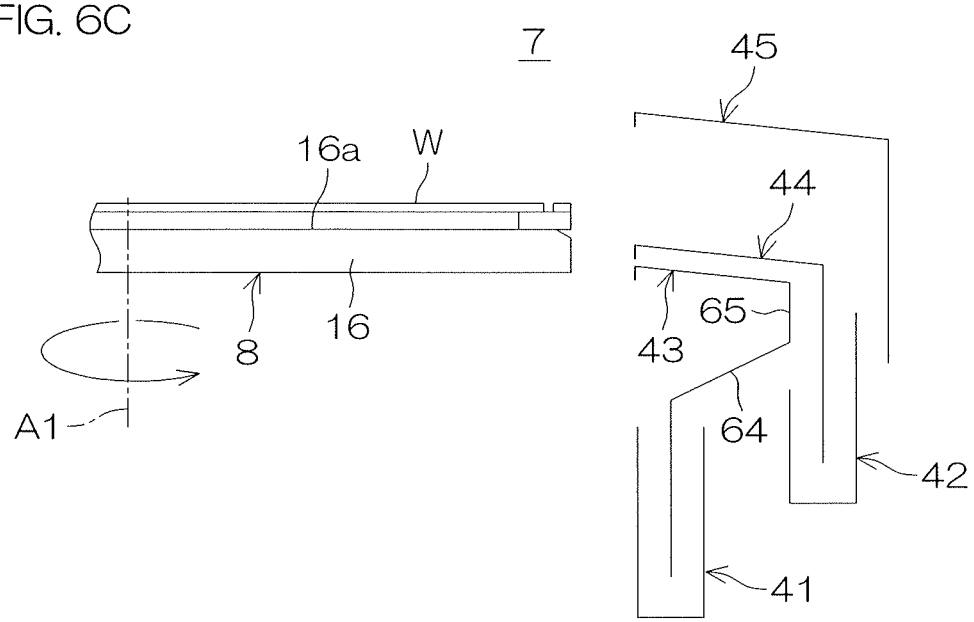
FIG. 6C is an illustrative diagram for describing a drying step.

FIG. 5 is a timing chart for describing timings of elevating and lowering the guard 43 and 44 in the SPM step S3. FIGS. 6A and 6B are illustrative diagrams for describing the SPM step S3. FIG. 6C is an illustrative diagram for describing the drying step S5.

Elevating and lowering of the guards 43 and 44 (that is, switching of the guard facing the peripheral end surface of the substrate W (the guard disposed at the position enabling capturing of the processing liquid expelled from the substrate W) (guard switching step)) in the substrate processing example shown in FIG. 4 shall now be described with reference to FIG. 2 to FIG. 5. FIGS. 6A to 6C shall be referenced where appropriate.

The SPM step S3 includes a first step T1, in which the processing cup 11 is in the first guard facing state, and a second step T2, in which the processing cup 11 is in the second guard facing state.

In the SPM step S3, a sufficient time for executing the SPM step S3 is secured to remove the resist from the front surface of the substrate W satisfactorily. Therefore, in a later half of the SPM step S3, the SPM supplied to the substrate W is hardly used for removing the resist. From a viewpoint of environmental consideration, it is preferable to limit disposal of the SPM to a minimum.

After some time from the start of the SPM step S3, a large amount of the resist residue is present on the front surface of the substrate W and therefore a large amount of the resist residue becomes contained in the SPM scattered (expelled) from the substrate W in this period. The SPM containing the large amount of the resist residue is not suitable for reuse and is thus preferably disposed of without being recovered.

Then, when a state is reached where the resist residue is not contained in the SPM expelled from the substrate W, the SPM is recovered and reused. In the present specification, the expression, "the resist residue is not contained," is intended to include a case where "the resist residue is not contained at all," a case where "the resist residue is hardly contained," and a case where "only a small amount of the resist residue is contained."

In the substrate processing example shown in FIG. 4, before the substrate carry-in S1, the processing cup 11 is in the retreated state. In the SPM step S3, after the SPM nozzle 18 is disposed at the processing position, the controller 3 controls the guard elevating/lowering unit 46 to elevate the first to third guards 43 to 45 to the upper positions to thereby make the first guard 43 face the peripheral end surface of the substrate W (realizing the first guard facing state) as shown in FIG. 6A. The first step T1 is thereby started.

In the SPM step S3 (first step T1), the SPM scattering from the peripheral edge portion of the substrate W lands on the inner wall 43a of the first guard 43 (inner wall 43a of the intermediate portion 65). The SPM captured by the inner wall 43a flows down along the inner wall 43a of the first guard 43, is received by the first cup 41, and fed to the first drain piping 52. The SPM fed to the first drain piping 52 is fed to a disposal processing equipment outside the apparatus.

As mentioned above, after some time from the start of the SPM step S3, a large amount of the resist residue becomes contained in the SPM scattering (being expelled) from the substrate W. In the first step T1, the SPM that is expelled from the substrate W and contains the resist residue is drained through the first flow space 101. That is, the SPM is not recovered and reused.

When the controller 3 judges that a guard switching timing, to be described below, has arrived, the controller 3 controls the guard elevating/lowering unit 46 to lower the first guard 43 from the upper position to the lower position (realizing the second guard facing state) as shown in FIG. 6B. During the guard switching, there is no change in a flow rate of the SPM discharged from the SPM nozzle 18 and in a rotational speed of the substrate W.

In the second step T2, the concentration of the SPM and the flow rate of the SPM discharged from the SPM nozzle 18 and the rotational speed of the substrate W are equivalent to those in the first step T1. In the second step T2, the SPM scattering from the peripheral edge portion of the substrate W is captured by the inner wall 44a of the second guard 44. The SPM flowing down the inner wall 44a of the second guard 44 is fed to the recovery tank 29 of the sulfuric acid supply portion 26 through the second cup 42, the common piping 55, and the recovery piping 56. That is, in the second step T2, the SPM scattering from the peripheral edge portion of the substrate W is recovered through the second flow space 102 and subject to reuse.

Thereafter, when an end timing of the SPM step S3 arrives, the second step T2 is also ended.

Also, in the rinsing step S4 executed subsequent to the SPM step S3, the processing cup 11 is in the first guard facing state. Therefore, after the second step T2 ends, the controller 3 controls the guard elevating/lowering unit 46 to raise the first guard 43 to the upper position (realizing the first guard facing state).

Also, in the drying step S5, the processing cup 11 is in the third guard facing state. Therefore, after the rinsing step S4 ends, the controller 3 controls the guard elevating/lowering unit 46 to lower the first and second guards 43 and 44 to the lower positions (realizing the third guard facing state).

Also, before carry-out of the substrate W (S7 of FIG. 4), the controller 3 controls the guard elevating/lowering unit 46 to lower the third guard 45 to the lower position. All of the first to third guards 43 to 45 are thereby disposed at the lower positions (realizing the retreated state).

Figure 7:
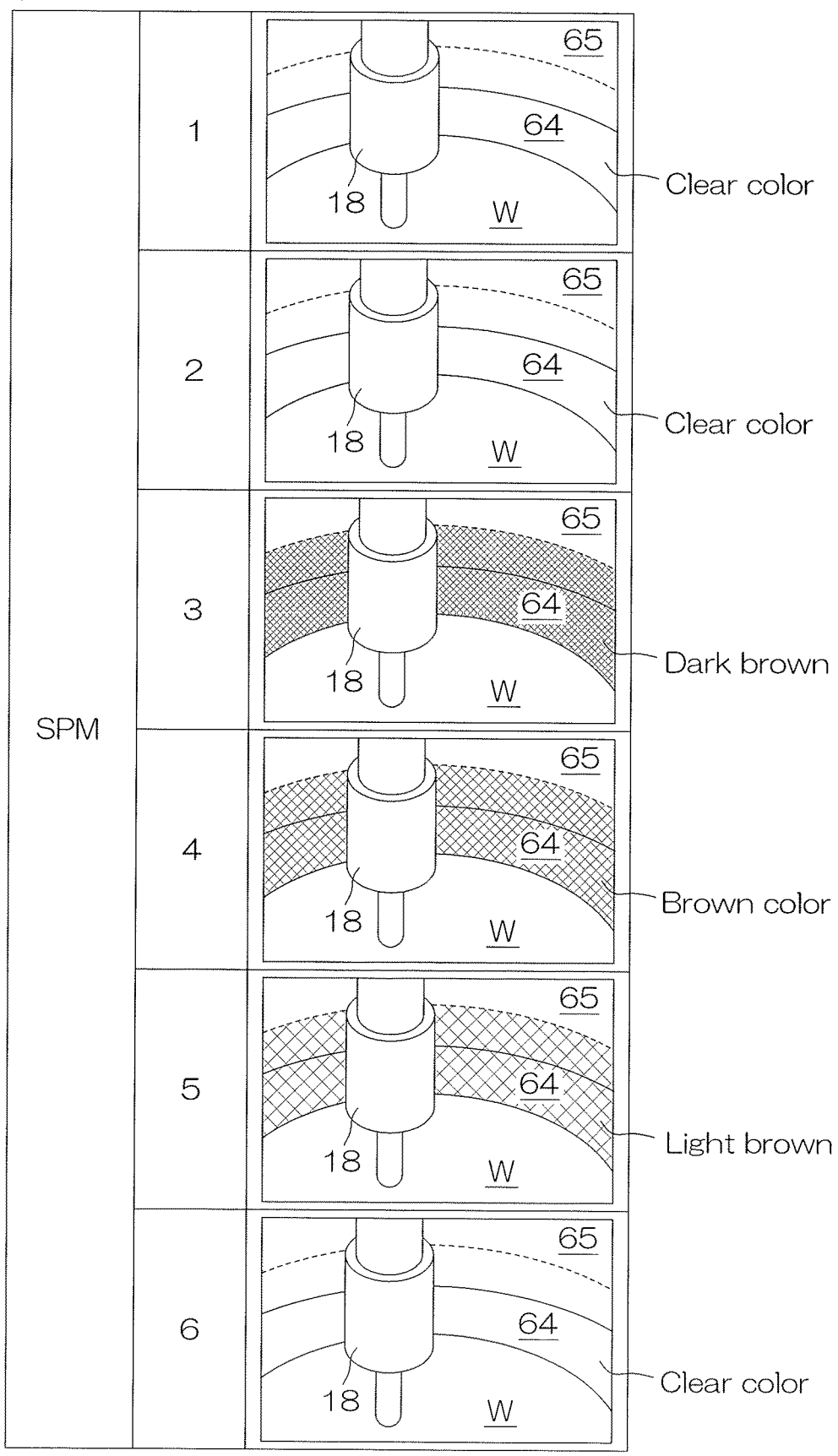
FIG. 7 is a diagram for describing a relationship of progress of processing in the SPM step and a color of SPM expelled from a substrate.
Figure 8:
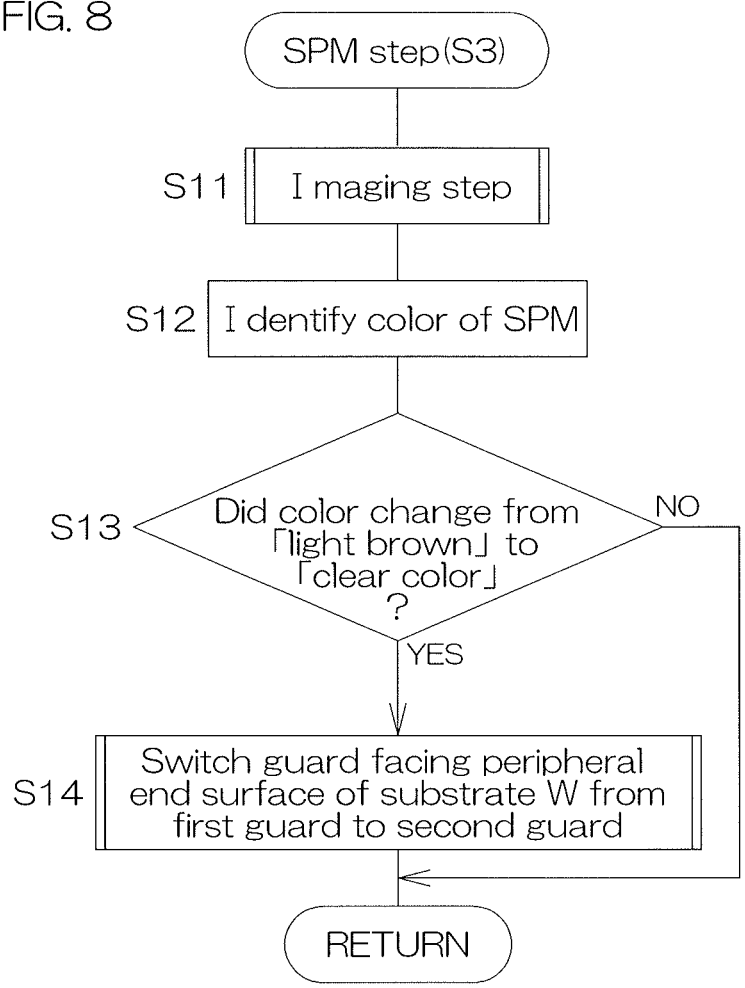
FIG. 8 is a flowchart for describing a guard switching timing in the SPM step.

FIG. 7 is a diagram for describing a relationship of progress of processing in the SPM step S3 (elapsed time from start of processing (SPM time)) and a color of the SPM expelled from the substrate W. FIG. 8 is a flowchart for describing the guard switching timing in the SPM step S3.

Detection of the guard switching timing shall now be described with reference to FIG. 2, FIG. 3, FIG. 7, and FIG. 8.

In FIG. 7, the inner wall of the cylindrical portion 64 when the processing cup 11 is in the first guard facing state (in the state where the guards are at the upper positions) is shown. In FIG. 7, the numbers "1" to "6" are attached in order of progress of the SPM step S3. As mentioned above, in the first step T1, the SPM scattering (being expelled) from the substrate W lands on the intermediate portion 65. The SPM that landed on the intermediate portion 65 thereafter flows down the cylindrical portion 64 and is received by the first cup 41.

The SPM expelled from the substrate W changes in color with the progress of the SPM step S3. The resist residue (carbonized matter) has a dark brown or black color.

Although the resist removing processing is performed on the substrate W from immediately after the start of the SPM step S3, the resist is not necessarily removed immediately. Therefore, for a brief period after the start of the SPM step S3, the SPM expelled from the substrate W has a clear color, which is the true color of the SPM.

Thereafter, on the substrate W, the resist begins to be removed and the resist residue becomes contained in the SPM expelled from the substrate W. Therefore, at a point at which some time has elapsed from the start of the SPM step S3, the amount of the resist residue contained in the SPM expelled from the substrate W reaches a peak. At this point, the color of the SPM expelled from the substrate W is dark brown or black, which reflects the color of the resist residue.

Thereafter, with the progress of the SPM step S3, a degree of removal of the resist removed on the substrate W decreases and the amount of the resist residue contained in the SPM expelled from the substrate W decreases gradually. Accordingly, the color of the SPM expelled from the substrate W also changes from a brown color to light brown and to the clear color as shown in FIG. 7.

In the present preferred embodiment, the guard switching timing is detected based on the color change of the SPM expelled from the substrate W. Specifically, a timing at which the color of the SPM expelled from the substrate W changes from light brown to the clear color is deemed to be the guard switching timing.

As shown in FIG. 8, from the start of the SPM step S3, the controller 3 starts picking up images of the inner wall 43a of the first guard 43 at the upper position (more specifically, the inner wall of the cylindrical portion 64 of the first guard 43) by the camera 153 (S11 of FIG. 8; imaging step). The optical image picked up by the camera 153 is converted to an electrical signal and provided to the controller 3 as an image signal. The imaged image is then prepared by the image processing portion 3B of the controller 3.

The controller 3 identifies the color of the chemical liquid included in the imaged image (S12 of FIG. 8). In the present preferred embodiment, the inner wall 43a of the first guard 43 has a color of high brightness (white color). On the other hand, the color of the SPM that contains the resist residue (carbonized matter) is a black color or a brownish color, such as dark brown, a brown color, light brown, etc., as mentioned above. A degree to which the resist residue is contained in the SPM can thus be identified satisfactorily.

Then, when the color of the chemical liquid included in the imaged image changes from "light brown" to the "clear color" (YES in S13 of FIG. 8), the controller 3 lowers the first guard 43 from the upper position to the lower position. The second guard facing state of the processing cup 11 is thereby realized (S14 of FIG. 8).

As described above, with the present preferred embodiment, the resist residue contained in the SPM expelled from the substrate W is detected in parallel with the SPM step S3. Based on the detection of the resist residue, the flow destination of the SPM expelled from the substrate W is switched from the first drain piping 52 to the recovery piping 56 during the SPM step S3. The flow destination of the SPM expelled from the substrate W can thereby be switched from draining to recovery in accordance with the degree to which the resist residue is contained in the SPM. The flow destination of the SPM expelled from the substrate W can thus be switched from draining to recovery at an appropriate timing.

Also, the flow destination of the SPM expelled from the substrate W can be switched from the first drain piping 52 to the recovery piping 56 by switching the guard disposed at the position of facing the peripheral end surface of the substrate W from the first guard 43 to the second guard 44. The switching of the flow destination of the SPM expelled from the substrate W (switching of draining→recovery) can thereby be performed easily.

Also, the flow destination of the SPM expelled from the substrate W is switched by making different the guard disposed at the SPM capturable position. Transfer of the resist residue via a guard to the SPM that does not contain the resist residue can thus be prevented more effectively in comparison to a case where the flow destination is switched by opening and closing of a valve interposed in a drain piping and a valve interposed in a recovery piping, which is branchingly connected to the drain piping, while making the guard, disposed at the SPM capturable position, be the same.

Also, the SPM expelled from the substrate W is imaged in parallel with the supplying of the SPM. Then, based on the color of the SPM included in the imaged image, the flow destination of the SPM expelled from the substrate W is switched from draining to recovery. Switching of the flow destination in accordance with the degree to which the resist residue is contained in the SPM expelled from the substrate W (switching of draining→recovery) can thereby be realized by a comparatively simple means.

Also, the SPM captured by the inner wall of the first guard 43 is picked up images in parallel with the supplying of the SPM. The inner wall of the first guard 43 and the SPM are included among the imaged objects. The inner wall 43a of the first guard 43 has the color of high brightness (the white color), the brightness of the background color in the imaged image is thus high, and therefore the degree to which foreign matter is contained in the SPM expelled from the substrate W can be identified even more satisfactorily.

Figure 9:
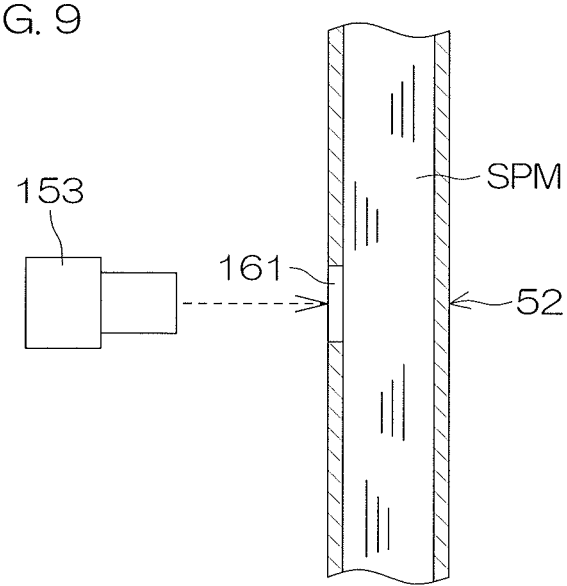
FIG. 9 is a diagram for describing a first modification example.

As shown in FIG. 9, the SPM flowing through an interior of the first drain piping 52 in the SPM step S3 may be an imaged object of the camera 153. In this case, the first drain piping 52 is formed using, for example, a chemical-resistant resin material (for example, a fluororesin, such as PFA (tetrafluoroethylene-perfluoroalkylvinyl ether copolymer), PCT FE (polychlorotrifluoroethylene), or PTFE (polytetrafluoroethylene), etc.). A pipe wall of the first drain piping 52 has a white color. A transparent window 161, formed using a transparent material, is formed in a portion of the pipe wall of the first drain piping 52. The camera 153 picks up images of the SPM flowing through the interior of the first drain piping 52 via the transparent window 161. In this case, the pipe wall (white color) of the first drain piping 52 and the SPM flowing through the interior of the first drain piping 52 are included among the objects picked by the camera. The color of the pipe wall of the first drain piping 52 can be identified in contrast to the color of the SPM in the state of containing the resist residue and therefore the degree to which the foreign matter is contained in the SPM expelled from the substrate W and flowing through the interior of the first drain piping 52 can be identified satisfactorily.

Also, in place of the SPM flowing through the first drain piping 52, the SPM flowing through the first flow space 101 can be made an object of imaging by the camera 153.

Figure 10:
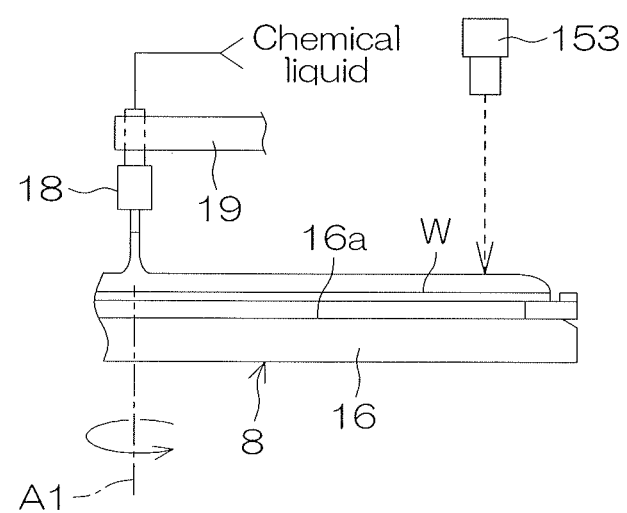
FIG. 10 is a diagram for describing a second modification example.

Also, as shown in FIG. 10, the liquid film of the chemical liquid (for example, SPM) formed on the upper surface of the substrate W (main surface of the substrate W) may be an imaged object of the camera 153. In this case, the upper surface of the substrate W and the liquid film of the chemical liquid are included among the objects picked up by the camera. If the color of the upper surface of the substrate W is a color that can be identified in contrast to the color of the chemical liquid in the state of containing the foreign matter, the degree to which the foreign matter (for example, resist residue) is contained in the chemical liquid expelled from the substrate W can be identified satisfactorily.

Figure 11:
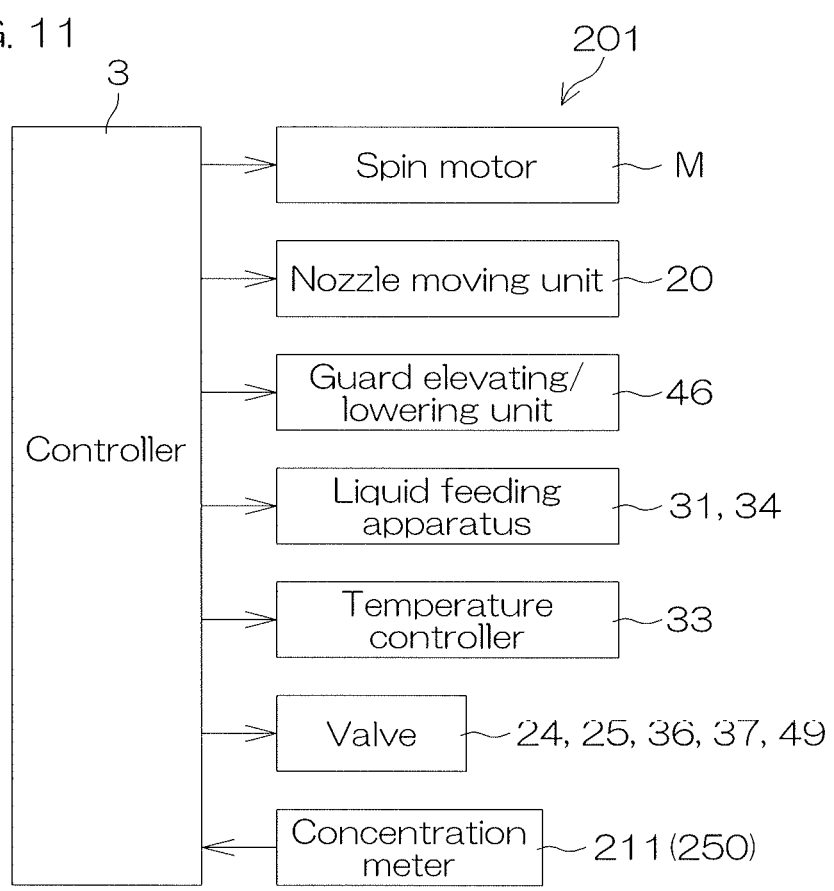
FIG. 11 is a block diagram for describing an electrical configuration of a main portion of a substrate processing apparatus according to a second preferred embodiment of the present invention.

FIG. 11 is a block diagram for describing an electrical configuration of a main portion of a substrate processing apparatus 201 according to a second preferred embodiment of the present invention. FIG. 12 is a flowchart for describing the guard switching timing in the SPM step S3 according to the second preferred embodiment of the present invention.

With the second preferred embodiment, portions in common to the first preferred embodiment described above shall be provided with the same reference signs as in FIG. 1 to FIG. 10 and description thereof shall be omitted.

A point by which the substrate processing apparatus 201 according to the second preferred embodiment differs from the substrate processing apparatus 1 according to the first preferred embodiment is that a foreign matter detecting unit 250 does not detect the resist residue based on the color of the chemical liquid included in the image picked up by the imaging unit 152 but detects the resist residue based on measurement of a concentration of the resist residue contained in the chemical liquid expelled from the substrate W. That is, the switching between the guards 43 and 44 is performed based on the measurement of the concentration of the resist residue contained in the chemical liquid expelled from the substrate W.

Specifically, as indicated by broken lines in FIG. 2, the foreign matter detecting unit 250 according to the second preferred embodiment includes a concentration meter 211 that detects the concentration of the resist residue contained in the SPM flowing through the first drain piping 52. The concentration meter 211 may, for example, be a concentration meter of a type that performs concentration measurement by making a probe be wetted by the SPM flowing through the first drain piping 52 or may be an optical type concentration meter. Detection output of the concentration meter 211 is arranged to be provided to the controller 3.

As shown in FIG. 12, from the start of the SPM step S3, the controller 3 monitors the detection output of the concentration meter 211 (foreign matter concentration measuring step; S21 of FIG. 12).

Then, when the resist residue concentration of the SPM flowing through the first drain piping 52 that is detected by the concentration meter 211 changes from a high concentration to a low concentration (not more than a threshold) (YES in S23 of FIG. 12), the controller 3 lowers the first guard 43 from the upper position to the lower position. The first guard facing state of the processing cup 11 is thereby realized (S24 of FIG. 12).

Also, in place of the SPM flowing through the first drain piping 52, the SPM flowing through the first flow space 101 may be made the object of concentration measurement by the concentration meter 211.

The same actions and effects as those of the first preferred embodiment described above are exhibited by the second preferred embodiment as well.

Although two preferred embodiments of the present invention were described above, the present invention may be implemented in yet other modes.

For example, in the first preferred embodiment, it is not necessary for an entirety of the first guard 43 to be of the white color and as long as a region that includes the inner wall 43a of the cylindrical portion 64 that is an imaged object has the white color, the color of other regions does not matter.

Also, although the white color is cited as an example of the "color of high brightness" in the first preferred embodiment, the color may be another color as long as the brightness is in a range of "8" to "10." It suffices that the color be a color of high brightness and it does not matter whether the color is a chromatic color or an achromatic color.

Also, when switching between the guards 43 and 44 in each of the first and second preferred embodiments, the supply flow rate of the SPM supplied to the substrate W may be decreased or the rotational speed of the substrate W may be slowed to weaken an impetus (speed) of the SPM scattering from the peripheral edge portion of the substrate W or decrease the amount of the SPM scattering from the peripheral edge portion. Contamination inside the chamber 7 can thereby be suppressed or prevented. Also, the supply of the SPM to the substrate W may be stopped temporarily over a portion or an entirety of a period of switching between the guards 43 and 44. In this case, expelling of the SPM from the substrate W can be eliminated and therefore contamination inside the chamber 7 can be suppressed or prevented more effectively.

Also, although it was described that in each of the first and second preferred embodiments, the switching of the guard is performed between the first guard 43 and the second guard 44, outwardly adjacent to the first guard 43, the switching of the guard may instead be performed between the second guard 44 and the third guard 45. Also, the switching of the guard may instead be performed between the first guard 43 and the third guard 45.

Also, an arrangement, which, in each of the first and second preferred embodiments, reuses the recovered SPM as sulfuric acid in the substrate processing apparatus 1 was described as an example, the recovered SPM may be used in another apparatus, etc., instead of reusing it in the substrate processing apparatus 1.

Also, in the substrate processing example described above, a first cleaning step of cleaning the upper surface of the substrate W using a first cleaning chemical liquid may be executed before the SPM step S3. Hydrofluoric acid (HF)

can be cited as an example of such a first cleaning chemical liquid. The first cleaning step is executed with the processing cup 11 being in the first guard facing state. If the first cleaning step is executed, a second rinsing step of rinsing off the first cleaning chemical liquid with the rinse liquid is executed thereafter. The second rinsing step is executed with the processing cup 11 being in the first guard facing state.

Also, the present invention is not restricted to the arrangement, in each of the first and second preferred embodiments, where the flow destination (the recovery piping 56 or the first drain piping 52) of the SPM expelled from the substrate W is differed by making different the guard disposed at the SPM capturable position. For example, a recovery piping may be branchingly connected to the first drain piping 52 and the flow destination of the SPM expelled from the substrate W may be arranged to be switched between the recovery piping and the first drain piping 52 by opening and closing of a valve interposed in the first drain piping 52 and a valve interposed in the recovery piping (the recovery piping connected to the sulfuric acid supply portion 26), which is branchingly connected to the drain piping.

Also, in the substrate processing example described above, a hydrogen peroxide water supplying step of supplying $H_2O_2$ to the upper surface (front surface) of the substrate W may be executed after the SPM step S3 and before the rinsing step S4. In this case, the controller 3 closes just the sulfuric acid valve 24 while maintaining the hydrogen peroxide water valve 36 in the opened state. Just the $H_2O_2$ is thereby supplied to the SPM nozzle 18 and the $H_2O_2$ is discharged from the discharge port of the SPM nozzle 18. In the hydrogen peroxide water supplying step, the processing cup 11 is in the first guard facing state.

Also, in the substrate processing example described above, a second cleaning step of cleaning the upper surface of the substrate W using a second cleaning chemical liquid may be executed after the rinsing step S4. SC1 (a liquid mixture containing $NH_4OH$ and $H_2O_2$) can be cited as an example of such a second cleaning chemical liquid. The second cleaning step is executed with the processing cup 11 being in the first guard facing state. If the second cleaning step is executed, a third rinsing step of rinsing off the second cleaning chemical liquid with the rinse liquid is executed thereafter. The third rinsing step is executed with the processing cup 11 being in the first guard facing state.

Also, an organic solvent replacing step of supplying an organic solvent (drying liquid), having a low surface tension, to replace the rinse liquid on the upper surface of the substrate W by the organic solvent, may be executed before the drying step S5. The organic solvent replacing step is executed with the processing cup 11 being in the third guard facing state.

Also, although as the SPM supplying unit 9 in each of the first and second preferred embodiments, that of a nozzle mixing type, with which the mixing of $H_2SO_4$ and $H_2O_2$ is performed in the interior of the SPM nozzle 18, was described as an example, a piping mixing type arrangement, with which a mixing portion, connected via a piping to an upstream side of the SPM nozzle 18, is provided and the mixing of $H_2SO_4$ and $H_2O_2$ is performed in the mixing portion, may be adopted instead.

Also, although with the substrate processing example of FIG. 4, a resist removing processing was described as an example, the processing is not restricted to the resist and may instead be that of removing another organic matter using the SPM.

Also, the chemical liquid supplied to the substrate W is not restricted to SPM and may be another chemical liquid.

BHF, DHF (dilute hydrofluoric acid), SC1 (ammonia-hydrogen peroxide mixture), SC2 (hydrochloric acid-hydrogen peroxide mixture), organic solvents (for example, NMP and acetone), nitric acid, ammonium phosphate, citric acid, sulfuric acid, dilute sulfuric acid, hydrofluoric nitric acid, undiluted HF, aqua regia, organic acids, such as TMAH (tetramethylammonium hydroxide aqueous solution), etc., and liquid mixtures of such organic acids can be cited as examples. Besides the above, $O_3$ water may also be used. In this case, the foreign matter contained in the chemical liquid includes metals, Si, and organic matter.

Also, although the processing cup 11 of a three-stage arrangement was described as an example, the processing cup 11 may be of a single stage (single cup) or of two stages or may be a multistage cup of four stages or more.

Also, although with each of the preferred embodiments described above, a case where the substrate processing apparatus 1 is an apparatus that processes the front surfaces of the substrates W constituted of semiconductor wafers was described, the substrate processing apparatus may instead be an apparatus that processes substrates, such as substrates for liquid crystal displays, substrates for FPDs (flat panel displays), such as organic EL (electroluminescence) displays, etc., substrates for optical disks, substrates for magnetic disks, substrates for magneto-optical disks, substrates for photomasks, ceramic substrates, substrates for solar cells, etc.

While preferred embodiments of the present invention have been described in detail, these are merely specific examples used to clarify the technical content of the present invention and the present invention should not be interpreted as being limited to these specific examples and the scope of the present invention are to be limited only by the appended claims.

The present application corresponds to Japanese Patent Application No. 2018-57500 filed on Mar. 26, 2018 in the Japan Patent Office, and the entire disclosure of this application is incorporated herein by reference.

What is claimed is:

1. A substrate processing method comprising:
   a substrate holding step of holding a substrate by a substrate holding unit;
   a chemical liquid supplying step of supplying a chemical liquid to a main surface of the substrate while rotating the substrate around a rotational axis passing through a central portion of the substrate;
   a foreign matter detecting step of detecting foreign matter, contained in the chemical liquid expelled from the substrate, in parallel with the chemical liquid supplying step; and
   a flow destination switching step of switching a flow destination of the chemical liquid expelled from the substrate from a drain piping to a recovery piping during the chemical liquid supplying step, based on the detection of the foreign matter by the foreign matter detecting step,
   wherein the flow destination switching step includes
   a guard switching step of switching a guard, disposed at a capturable position, at which the chemical liquid expelled from the substrate can be captured, from a cylindrical first guard, capturing and guiding the chemical liquid to a first flow space in communication with the drain piping, to a cylindrical second guard, provided separately from the first guard and capturing and guiding the chemical liquid to a second flow space in communication with the recovery piping.

2. The substrate processing method according to claim 1, wherein the foreign matter detecting step includes
an imaging step of picking up images of the chemical liquid expelled from the substrate in parallel with the chemical liquid supplying step, and
a step where the foreign matter contained in the chemical liquid expelled from the substrate is detected based on a color of the chemical liquid included in the image picked up by the imaging step.

3. The substrate processing method according to claim 1, wherein a resist is formed on the main surface of the substrate, and
the chemical liquid supplied to the main surface of the substrate in the chemical liquid supplying step includes SPM (Sulfuric acid/hydrogen Peroxide Mixture).

4. A substrate processing method comprising:
a substrate holding step of holding a substrate by a substrate holding unit;
a chemical liquid supplying step of supplying a chemical liquid to a main surface of the substrate while rotating the substrate around a rotational axis passing through a central portion of the substrate;
a foreign matter detecting step of detecting foreign matter, contained in the chemical liquid expelled from the substrate, in parallel with the chemical liquid supplying step; and
a flow destination switching step of switching a flow destination of the chemical liquid expelled from the substrate from a drain piping to a recovery piping during the chemical liquid supplying step, based on the detection of the foreign matter by the foreign matter detecting step,
wherein the foreign matter detecting step includes an imaging step of picking up images of the chemical liquid expelled from the substrate in parallel with the chemical liquid supplying step, and a step where the foreign matter contained in the chemical liquid expelled from the substrate is detected based on a color of the chemical liquid included in the image picked up by the imaging step,
wherein the imaging step includes a step of picking up images of the chemical liquid that is captured by an inner wall of a cylindrical first guard arranged to capture the chemical liquid expelled from the substrate.

5. The substrate processing method according to claim 4, wherein the inner wall of the first guard has a color of high brightness.

6. The substrate processing method according to claim 4, wherein the flow destination switching step includes
a guard switching step of switching a guard, disposed at a capturable position, at which the chemical liquid expelled from the substrate can be captured, from a cylindrical first guard, capturing and guiding the chemical liquid to a first flow space in communication with the drain piping, to a cylindrical second guard, provided separately from the first guard and capturing and guiding the chemical liquid to a second flow space in communication with the recovery piping.

7. The substrate processing method according to claim 4, wherein a resist is formed on the main surface of the substrate, and
the chemical liquid supplied to the main surface of the substrate in the chemical liquid supplying step includes SPM (Sulfuric acid/hydrogen Peroxide Mixture).

8. A substrate processing method comprising:
a substrate holding step of holding a substrate by a substrate holding unit;
a chemical liquid supplying step of supplying a chemical liquid to a main surface of the substrate while rotating the substrate around a rotational axis passing through a central portion of the substrate;
a foreign matter detecting step of detecting foreign matter, contained in the chemical liquid expelled from the substrate, in parallel with the chemical liquid supplying step; and
a flow destination switching step of switching a flow destination of the chemical liquid expelled from the substrate from a drain piping to a recovery piping during the chemical liquid supplying step, based on the detection of the foreign matter by the foreign matter detecting step,
wherein the foreign matter detecting step includes an imaging step of picking up images of the chemical liquid expelled from the substrate in parallel with the chemical liquid supplying step, and a step where the foreign matter contained in the chemical liquid expelled from the substrate is detected based on a color of the chemical liquid included in the image picked up by the imaging step,
wherein the imaging step includes a step of picking up images of the chemical liquid present on the main surface of the substrate.

9. The substrate processing method according to claim 8, wherein the flow destination switching step includes
a guard switching step of switching a guard, disposed at a capturable position, at which the chemical liquid expelled from the substrate can be captured, from a cylindrical first guard, capturing and guiding the chemical liquid to a first flow space in communication with the drain piping, to a cylindrical second guard, provided separately from the first guard and capturing and guiding the chemical liquid to a second flow space in communication with the recovery piping.

10. The substrate processing method according to claim 8, wherein a resist is formed on the main surface of the substrate, and
the chemical liquid supplied to the main surface of the substrate in the chemical liquid supplying step includes SPM (Sulfuric acid/hydrogen Peroxide Mixture).

11. A substrate processing method comprising:
a substrate holding step of holding a substrate by a substrate holding unit;
a chemical liquid supplying step of supplying a chemical liquid to a main surface of the substrate while rotating the substrate around a rotational axis passing through a central portion of the substrate;
a foreign matter detecting step of detecting foreign matter, contained in the chemical liquid expelled from the substrate, in parallel with the chemical liquid supplying step; and
a flow destination switching step of switching a flow destination of the chemical liquid expelled from the substrate from a drain piping to a recovery piping during the chemical liquid supplying step, based on the detection of the foreign matter by the foreign matter detecting step,
wherein the foreign matter detecting step includes an imaging step of picking up images of the chemical liquid expelled from the substrate in parallel with the chemical liquid supplying step, and a step where the foreign matter contained in the chemical liquid expelled from the substrate is detected based on a color of the chemical liquid included in the image picked up by the imaging step, wherein the imaging step includes a step of picking up images of the foreign matter contained in the chemical liquid flowing through a first flow space, being in communication with the drain piping and being a flow space, which is provided in an interior of a processing cup surrounding a periphery of the substrate holding unit and through which the chemical liquid expelled from the substrate flows, and/or in the chemical liquid flowing through the drain piping.

12. The substrate processing method according to claim 11, wherein the flow destination switching step includes
a guard switching step of switching a guard, disposed at a capturable position, at which the chemical liquid expelled from the substrate can be captured, from a cylindrical first guard, capturing and guiding the chemical liquid to a first flow space in communication with the drain piping, to a cylindrical second guard, provided separately from the first guard and capturing and guiding the chemical liquid to a second flow space in communication with the recovery piping.

13. The substrate processing method according to claim 11, wherein a resist is formed on the main surface of the substrate, and
the chemical liquid supplied to the main surface of the substrate in the chemical liquid supplying step includes SPM (Sulfuric acid/hydrogen Peroxide Mixture).

14. A substrate processing method comprising:
a substrate holding step of holding a substrate by a substrate holding unit;
a chemical liquid supplying step of supplying a chemical liquid to a main surface of the substrate while rotating the substrate around a rotational axis passing through a central portion of the substrate;
a foreign matter detecting step of detecting foreign matter, contained in the chemical liquid expelled from the substrate, in parallel with the chemical liquid supplying step; and
a flow destination switching step of switching a flow destination of the chemical liquid expelled from the substrate from a drain piping to a recovery piping during the chemical liquid supplying step, based on the detection of the foreign matter by the foreign matter detecting step,
wherein the foreign matter detecting step further includes a foreign matter concentration measuring step of measuring a concentration of the foreign matter contained in the chemical liquid expelled from the substrate,
wherein a resist is formed on the main surface of the substrate, and the chemical liquid supplied to the main surface of the substrate in the chemical liquid supplying step includes SPM (Sulfuric acid/hydrogen Peroxide Mixture).

15. The substrate processing method according to claim 14, wherein the foreign matter concentration measuring step includes a step of measuring the concentrations or concentration of the foreign matter contained in the chemical liquid flowing through a first flow space, being in communication with the drain piping and being a flow space, which is provided in an interior of a processing cup surrounding the periphery of the substrate holding unit and through which the chemical liquid expelled from the substrate flows, and/or in the chemical liquid flowing through the drain piping.

16. The substrate processing method according to claim 14, wherein the flow destination switching step includes
a guard switching step of switching a guard, disposed at a capturable position, at which the chemical liquid expelled from the substrate can be captured, from a cylindrical first guard, capturing and guiding the chemical liquid to a first flow space in communication with the drain piping, to a cylindrical second guard, provided separately from the first guard and capturing and guiding the chemical liquid to a second flow space in communication with the recovery piping.

* * * * *